US012782397B2

(12) United States Patent
Brookes et al.

(10) Patent No.: US 12,782,397 B2
(45) Date of Patent: Nov. 3, 2026

(54) CURRENT SENSOR

(71) Applicant: Analog Devices International Unlimited Company, Limerick (IE)

(72) Inventors: Bailey Brookes, Limerick (IE); Jonathan Ephraim David Hurwitz, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 259 days.

(21) Appl. No.: 18/505,862

(22) Filed: Nov. 9, 2023

(65) Prior Publication Data

US 2025/0076344 A1 Mar. 6, 2025

Related U.S. Application Data

(60) Provisional application No. 63/579,848, filed on Aug. 31, 2023.

(51) Int. Cl.
*G01R 15/18* (2006.01)
*G01R 19/00* (2006.01)

(52) U.S. Cl.
CPC ....... *G01R 15/181* (2013.01); *G01R 19/0092* (2013.01)

(58) Field of Classification Search
CPC .... G01R 15/181; G01R 19/0092; G01R 1/04; G01R 1/0408
USPC ........................................................ 324/126
See application file for complete search history.

(56) References Cited

U.S. PATENT DOCUMENTS

| | | | | |
|---|---|---|---|---|
| 6,313,623 | B1 | 11/2001 | Kojovic et al. | |
| 6,624,624 | B1 | 9/2003 | Karrer et al. | |
| 10,416,195 | B2 | 9/2019 | Hurwitz et al. | |
| 10,859,605 | B2 | 12/2020 | Hurwitz | |
| 11,024,576 | B1 * | 6/2021 | West | G01R 15/181 |
| 11,315,725 | B2 | 4/2022 | Hurwitz | |
| 2002/0011832 | A1 * | 1/2002 | Berkcan | G01R 15/181 324/127 |
| 2007/0152651 | A1 | 7/2007 | Shiokawa et al. | |
| 2014/0125321 | A1 * | 5/2014 | Dames | G01R 15/186 324/127 |
| 2016/0116504 | A1 | 4/2016 | Tang et al. | |

(Continued)

FOREIGN PATENT DOCUMENTS

| | | |
|---|---|---|
| CN | 101625377 A | 1/2010 |
| CN | 108100558 A | 6/2018 |

OTHER PUBLICATIONS

Habrych, M, et al., "Applicability of Rogowski coils made in PCB HDI technology in power system protections", 2015 Modern Electric Power Systems (MEPS), Wroclaw, Poland, doi: 10.1109/MEPS.2015.7477212, (2015), 1-4.

(Continued)

*Primary Examiner* — Arleen M Vazquez
*Assistant Examiner* — Robert P Alejnikov, Jr.
(74) *Attorney, Agent, or Firm* — Schwegman Lundberg & Woessner, P.A.

(57) ABSTRACT

A current sensor assembly is provided which includes a first substrate or PCB including two current measurement coils and a second substrate or PCB which includes at least one current measurement coils. The arrangement across multiple substrates or PCBs allows current carrying conductors to be positioned in close proximity, reducing the overall size of the assembly.

18 Claims, 27 Drawing Sheets

(56) References Cited

U.S. PATENT DOCUMENTS

| | | | | |
|---|---|---|---|---|
| 2017/0356935 | A1* | 12/2017 | Hurwitz | G01R 19/12 |
| 2019/0187184 | A1* | 6/2019 | Urankar | G01R 15/181 |
| 2020/0141981 | A1* | 5/2020 | Hurwitz | G01R 1/18 |
| 2020/0386792 | A1 | 12/2020 | Rondot et al. | |
| 2021/0318357 | A1* | 10/2021 | Parker | G01R 22/068 |
| 2023/0296648 | A1 | 9/2023 | Hoffman et al. | |
| 2023/0296652 | A1 | 9/2023 | Hoffman et al. | |

OTHER PUBLICATIONS

Ming, Lei, et al., "Structure and Modelling of four-layer screen-returned PCB Rogowski coil with very few turns for high-bandwidth SiC current measurement", IET Power Electronics, 13(4), (2020), 765-775.

Shi, Yafei, et al., "A Review of Traditional Helical to Recent Miniaturized Printed Circuit Board Rogowski Coils for Power-Electronic Applications", IEEE Transactions on Power Electronics, 35(11), (Nov. 2020), 12207-12222.

Wang, J, et al., "A Design Method of PCB Rogowski Coil in Limited Space and Modified Integral Circuit", IEEE Sensors Journal, 20(11), (2020), 5801-5808.

"European Application Serial No. 24190013.3, Extended European Search Report mailed Jan. 30, 2025", 7 pgs.

* cited by examiner

CURRENT SENSOR

TECHNICAL FIELD

The present disclosure relates to current sensors, and in particular current sensors implemented on printed circuit boards.

BACKGROUND

Current sensors detect and measure an electrical current passing through a conductor. They are used in many different applications, for example, to provide accurate current measurement in utility meters.

Rate-of-change of current sensors, for example Rogowski coils, do not require any physical connection to the current carrying conductor, and are therefore isolated from the current carrying conductor without the need for any further isolating componentry. Rate of change of current sensors include current measurement coils to detect changes in a magnetic field generated by a current carrying conductor. Current measurement coils may take up a large amount of space around the current carrying conductor.

SUMMARY

According to a first aspect of the disclosure there is provided a current sensor assembly comprising: a first substrate comprising: a first hole for receiving a first current carrying conductor through the first hole at an angle normal to a surface of the first substrate; a first current measurement coil formed on the first substrate, the first current measurement coil arranged around a circumference of the first hole; a second hole for receiving a second current carrying conductor through the second hole at an angle normal to the surface of the first substrate; a second current measurement coil formed on the first substrate, the second current measurement coil arranged around a circumference of the second hole; and a first opening between the first hole and the second hole, wherein the first opening is for receiving a third current carrying conductor through the first opening at an angle normal to the surface of the first substrate; and a second substrate comprising: a third hole for receiving the third current carrying conductor through the third hole at an angle normal to a surface of the second substrate; and a third current measurement coil formed on the second substrate, the third current measurement coil arranged around a circumference of the third hole.

According to a second aspect of the disclosure there is provided a current measurement system comprising: a first substrate comprising: a first hole; a first current measurement coil formed on the first substrate around the first hole; a second hole; a second current measurement coil formed on the first substrate around the second hole; a first opening; a second substrate comprising: a third hole; a third current measurement coil formed on the second substrate around the third hole; a first current carrying conductor; a second current carrying conductor; a third current carrying conductor; and wherein the first substrate and the second substrate are aligned such that the first current carrying conductor passes through the first hole, the second current carrying conductor passes through the second hole and the third current carrying conductor passes through the first opening and the third hole.

According to a third aspect of the disclosure there is provided a current measurement system comprising: a first substrate comprising: a first hole; a first current measurement coil formed on the first substrate, the first current measurement coil arranged around a circumference of the first hole; a second hole; a second current measurement coil formed on the first substrate, the second current measurement coil arranged around a circumference of the second hole; a first opening between the first hole and the second hole; and a second substrate comprising: a third hole; a third current measurement coil formed on the second substrate, the third current measurement coil arranged around a circumference of the third hole; a fourth hole; a fourth current measurement coil formed on the second substrate, the fourth current measurement coil arranged around a circumference of the fourth hole; a second opening between the third hole and the fourth hole; and wherein the first substrate and the second substrate are positioned such that the first opening is aligned with the third hole, and the second opening is aligned with the second hole.

According to a fourth aspect of the disclosure there is provided a method for installing a current carrying conductor in a current sensor assembly, the current sensor assembly comprising a first substrate and a second substrate, the first substrate comprising a first opening and the second substrate comprising a first hole, wherein the first opening is an oblong opening with a first width and a first length, wherein the first width is less than the first length, the method comprising: passing the current carrying conductor through the first opening of the first substrate, a first end of the current carrying conductor having an oblong cross section having a second width and a second length, wherein the second width is less than the second length, wherein the current carrying conductor is passed through the first opening in a first orientation such that the first length aligns (i.e., is substantially parallel with) the second length; passing the current carrying conductor through the first hole of the second substrate; and rotating the current carrying conductor about its principle axis so that the current carrying conductor is in a second orientation (for example, rotating it by about 90 degrees about its principal axis). The method may further comprise connecting the first end of the current carrying conductor to a terminal block. Wherein the first substrate comprises a first current measurement coil and a second current measurement coil, the second substrate comprises a third current measurement coil surrounding the first hole, the first opening is located between the first current measurement coil and the second current measurement coil.

BRIEF DESCRIPTION OF THE DRAWINGS

Aspects of the disclosure will now be described by way of example only and with reference to the accompanying drawings, wherein like reference numerals refer to like parts, and wherein.

DETAILED DESCRIPTION

There exists a need to provide an improved means of current measurement of the currents in multiple conductors, whilst allowing the conductors to be positioned closer to each other and whilst maintaining acceptable measurement sensitivity. Current measurement coils measure the rate of change of current in a conductor which they surround. As such, a certain pitch or clearance is required between the respective conductors to allow room for the current measurement coils.

The present disclosure provides an improved current sensor assembly which includes multiple current measurement coils distributed across a number of printed circuit boards or substrates. By providing the current measurement coils across a number of substrates, with openings between the current measurement coils to allow conductors to pass through to a current measurement coil on another substrate, the system may be arranged with a smaller conductor pitch than is otherwise possible.

Figure 1:
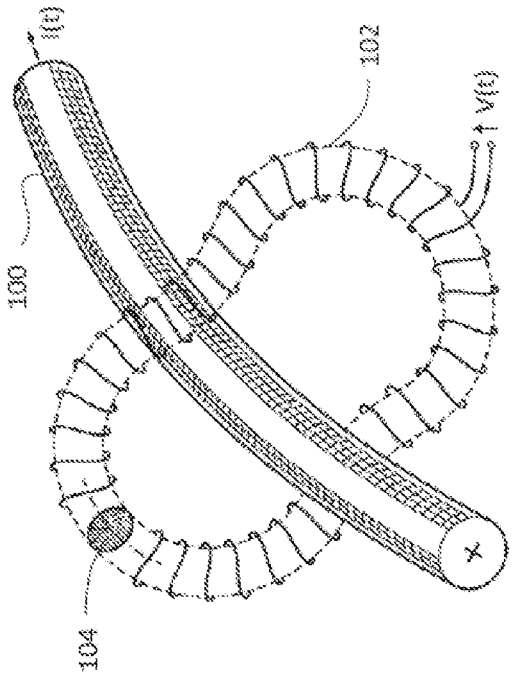
FIG. 1 is a schematic representation of a Rogowski coil.

FIG. 1 is a diagram of a Rogowski coil. So as to measure the current I(t) flowing through a current carrying conductor 100, a measurement coil 102 is arranged such that the current carrying conductor 100 passes through the measurement coil. The measurement coil 102 is wound as a helix, such that a loop or turn of the helix encloses a cross sectional area 104, A. The current carrying conductor 100 may be, for example, a busbar.

As the current I(t) in the current carrying conductor 100 changes, the field generated by the current also changes. The positioning of the measurement coil causes a voltage to be induced in the measurement coil 102 which is proportional to the rate of change of current, dI/dt. Therefore, integrating the output v (t) of the measurement coil provides a value proportional to the current.

Figure 2:
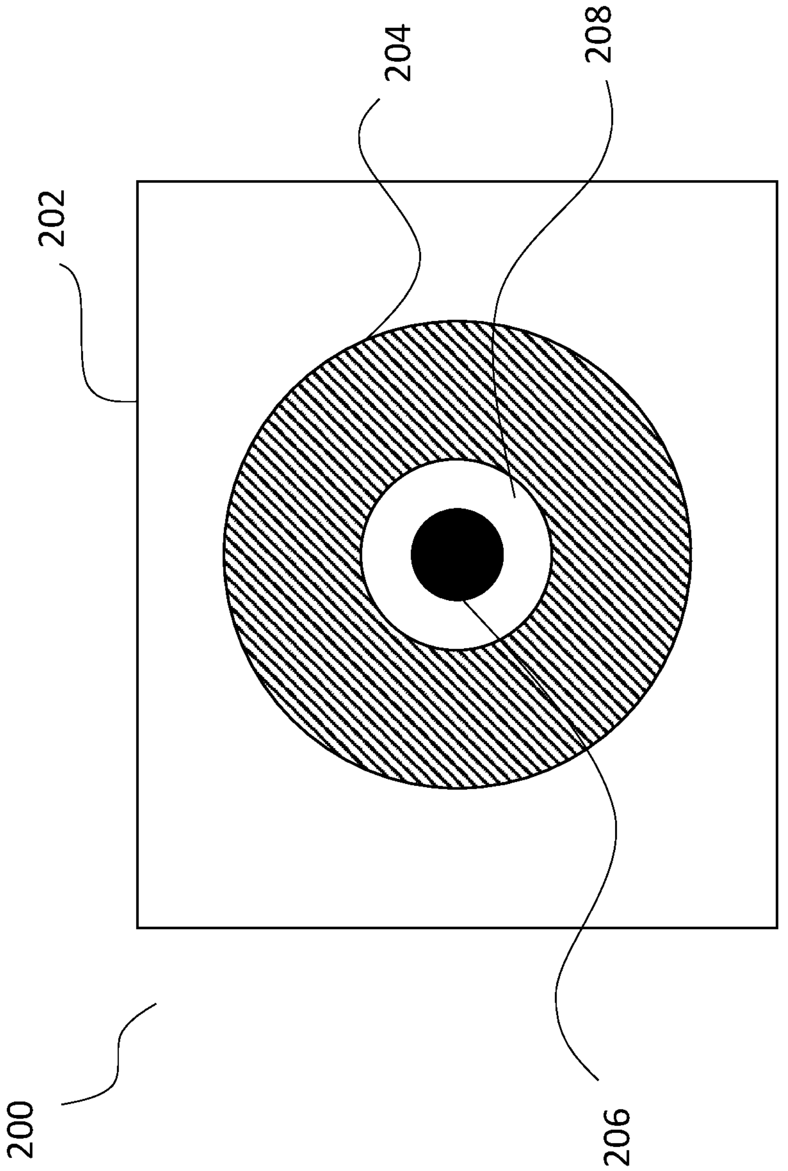
FIG. 2 is a representation of a current measurement coil on a substrate.

Current measurement coils may be implemented on PCBs or substrates, formed using a plurality of conductors connected by vias. For example, FIG. 2 shows a current measurement system 200 comprising a substrate 202. A current measurement coil 204, for example a Rogowski coil, is implemented on the substrate such that it surrounds a current carrying conductor 206. A hole 208 may be provided in the substrate 202 to allow the current carrying conductor 206 to pass through the substrate 202, for example at an angle that is normal to a surface of the substrate 202. Current measurement coils may be implemented on PCBs in a number of different ways, for example using a plurality of conductors on multiple layers of the substrates which are connected by vias. For example, current measurement coils implemented on PCBs or substrates are described in U.S. Pat. No. 10,859,605 B2 and U.S. Ser. No. 17/695,793, which are incorporated herein by reference in their entirety. To ease understanding, the current measurement coils will be represented by circles 204 surrounding respective holes 208.

In some electrical systems, for example three phase systems, it is desirable to measure the current in a plurality of current carrying conductors which may be located close to one another, for example in a bus-bar arrangement.

For example, in a three-phase system it may be desirable to measure the currents in at least some of the three individual phases and/or the return/neutral line.

Figure 3:
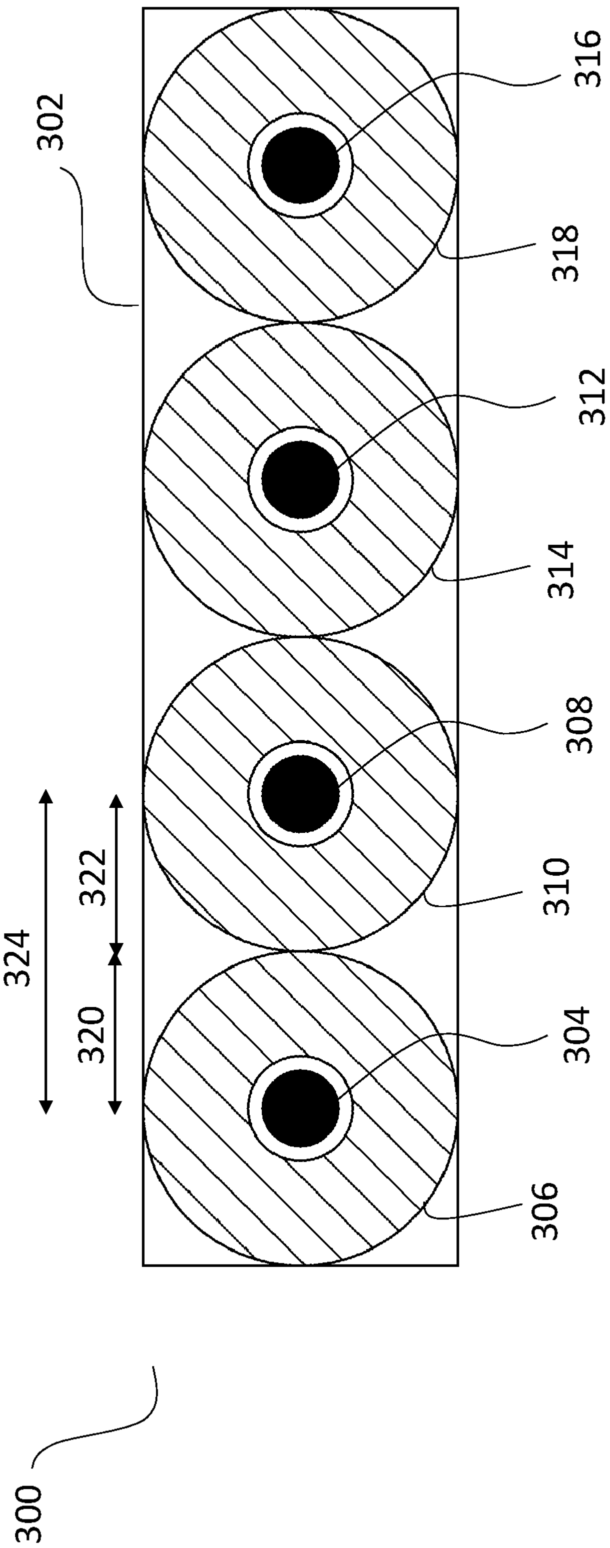
FIG. 3 is a representation of four current measurement coils implemented on a single substrate.

FIG. 3 shows a substrate 302 which includes 4 current measurement coils surrounding four current carrying conductors. A first current measurement coil 306 is arranged to surround a first current carrying conductor 304. A second current measurement coil 310 is arranged to surround a second current carrying conductor 308. A third current measurement coil 314 is arranged to surround a third current carrying conductor 312. A fourth current measurement coil is arranged to surround a fourth current carrying conductor 316.

Each of the current measurement coils has a radius 320. Typically, the greater the radius 320 of the measurement coil, the greater the area of the current measurement coil and thus the greater the sensitivity of the measurement coil. However, in the arrangement of FIG. 3, each of the current carrying conductors must be separated by a pitch or distance, 324, which is large enough to accommodate the measurement coils. For example, the first current carrying conductor 304 and the second current carrying conductor 308 are separated by a distance 324 which is at least the sum of the radius 320 of the first measurement coil 306 and the radius 322 of the second measurement 310. As such, the larger the radii of the measurement coils, the larger the required distance 324 between the current carrying conductors.

In the configuration of FIG. 3, there is therefore a trade-off between the sensitivity of the measurement coils and the allowable pitch between conductors.

FIG. 4 shows a current sensor assembly 400 in accordance with an aspect of the present disclosure. The assembly 400 comprises multiple substrates or printed circuit boards, with the current measurement coils divided between the substrates. FIG. 4*a* shows a first substrate 402 viewed from a direction normal to the surface of the substrate. FIG. 4*b* shows a second substrate 404 viewed from a direction normal to the surface of the substrate. FIG. 4*c* shows a view of the first and second substrates arranged such that they are stacked. This view is from a direction normal to the two substrates with the first substrate 402 on top of the second substrate 404. The coils on the second substrate 404 would not actually be visible since they would be obscured by the first substrate 402, but are represented in the Figure to assist with understand of the relative arrangements of the coils and substrates.

The first substrate 402 comprises a first hole 406. The first hole 406 is sized such that it is suitable for receiving a first current carrying conductor 432 at an angle normal to the surface of the first substrate 402. A first current measurement coil 408 is formed on the first substrate 402 around a circumference of the first hole 406.

The first substrate 402 further comprises a second hole 410. The second hole 410 is sized such that is suitable for receiving a second current carrying conductor 436 at an angle normal to the surface of the first substrate 402. A second current measurement coil 412 is formed on the first substrate 402 around the circumference of the second hole 410.

A first opening 424 is located between the first hole 406 and the second hole 410. The first opening 424 is suitable for receiving a third current carrying conductor 424 at an angle normal to the surface of the first substrate 402.

The second substrate 404 comprises a third hole 414. The third hole 414 is sized such that it is suitable for receiving the third current carrying conductor 434 at an angle normal to the surface of the second substrate 404. A third current measurement coil 416 is formed on the second substrate 404 around the circumference of the third hole 414.

The second substrate 404 further comprises a fourth hole 418. Fourth hole 418 is sized such that is suitable for receiving a fourth current carrying conductor 438 at an angle normal to the surface of the second substrate 404. A fourth current measurement coil 420 is formed on the second substrate 404 around the circumference of the fourth hole 418.

A second opening 430 is located between the third hole 414 fourth hole 418. The second opening 430 is suitable for receiving the second current carrying conductor 436 at an angle normal to the surface of the second substrate 404.

The current sensor assembly 400 is arranged such that the first substrate 402 and the second substrate 404 are positioned parallel to one another. This allows the current carrying conductors to pass through respective holes and openings on both the first substrate 402 and the second substrate 404.

The measurement coils are capable of detecting the current in the current carrying conductors. The measurement coils may be connected to active or passive electronics for measuring the currents in the conductors, for example by integrating the voltage output by the measurement coils to provide signals which are proportional to a rate of change of current in the current carrying conductors.

A third opening 426 may be located on the first substrate 402. The third opening is suitable for receiving the fourth current carrying conductor 438 at an angle normal to the surface of the first substrate 402.

A fourth opening 428 may be located on the second substrate 404. The fourth opening 428 is suitable for receiving the first current carrying conductor 432 at an angle normal to the surface of the second substrate 404.

As is shown in FIG. 4, the third opening 426 and the fourth opening 428 are located towards the edges of the first substrate 402 and the second substrate 404 respectively. These openings are optional openings. Instead of these openings, smaller substrates may be used the second current measurement coil 412 and the third current measurement coil 416 may abut, or be very close to, the edge of their respective substrates (as is the case for coils 404 and 420 on the other side of the substrates). As such the fourth current carrying conductor 438 may pass by the edge of the first substrate 402 and through the fourth hole 418, and the first current carrying conductor 432 may pass by the edge of the third current measurement coil 416 and through the first hole 406. This allows the substrates 402 and 404 to be smaller, which may reduce costs and/or manufacturing complexity.

By arranging the current measurement coils across two substrates, the overall size of the current sensor assembly 400 may be smaller. The pitch/distance 422 between adjacent current carrying conductors (for example between the first current carrying conductor 432 and the third current carrying conductor 434) may be less than the sum of the radii 420 of the first current measurement coil 408 and the second current measurement coil 416. Consequently, current measurement coils, such as Rogowski coils, may be used with conductor pitches that have a relatively small pitch (for example, with conductor busbars that have relatively small pitches) whilst still maintaining a reasonable coil radii 420 and thus a reasonable measurement sensitivity. Optionally, each of the current measurement coils may have a different radius depending on the desired sensitivity of the respective current measurement coil.

Further, the current sensor assembly 400 includes multiple current measurement coils on each substrate. For example, the first substrate 402 comprises both the first current measurement coil 408 and the second current measurement coil 412. This improves the sensitivity of the system by minimising the number of substrate interconnects required. Substrate interconnects reduce the system sensitivity by picking up noise. As such, the current sensor assembly 400 enables tighter or smaller conductor pitches whilst maintaining measurement accuracy by ensuring acceptable coil radii with minimal substrate interconnects.

Figure 5A:
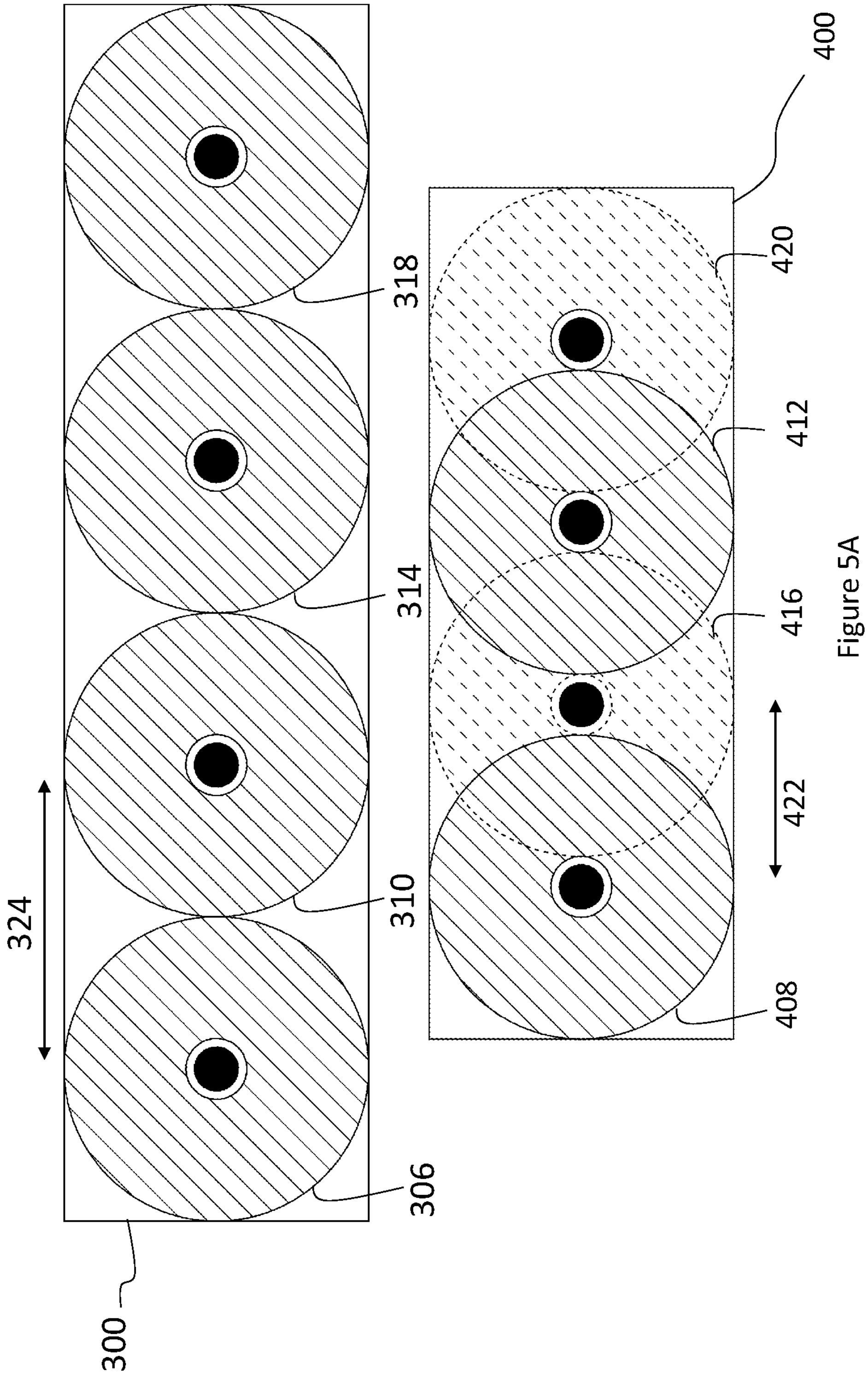
FIG. 5A is a comparison of the current sensor of FIG. 3 and FIG. 4C.

FIG. 5A shows how the current sensor assembly 400 with coils divided across two substrates is substantially smaller than the current sensor 300 which is distributed across a single substrate. This allows the current carrying conductors to be closer to each other, with the pitch 422 between the current carrying conductors of the current sensor assembly 400 smaller than the pitch 324 between the current carrying conductors of the current sensor assembly 300.

Furthermore, it should be noted that even if the pitch 422 between the current carrying conductors were the same as the pitch 324, the system is still beneficial as it may then enable measurement coils with larger radii, thereby improving sensitivity. As a result, the system of the present disclosure may enable small inter-conductor pitches whilst still maintaining acceptable measurement sensitivity, or may improve measurement sensitivity for the same inter-conductor pitch.

Figure 4A:
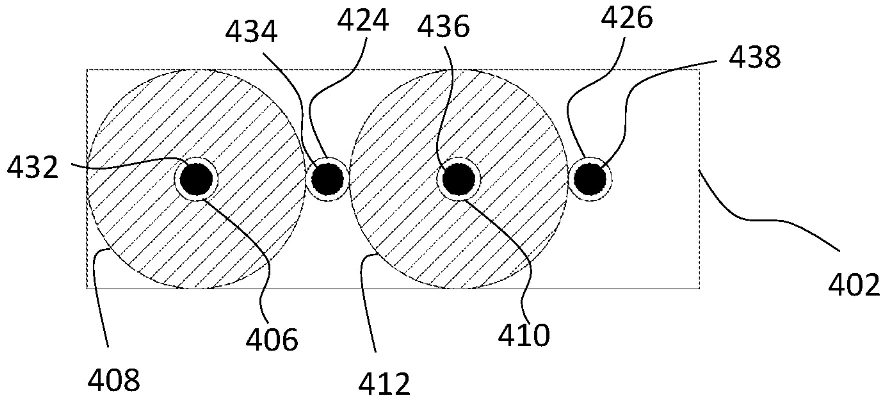
FIG. 4A is a representation of a first substrate of a current sensor assembly distributed across two substrates.
Figure 4B:
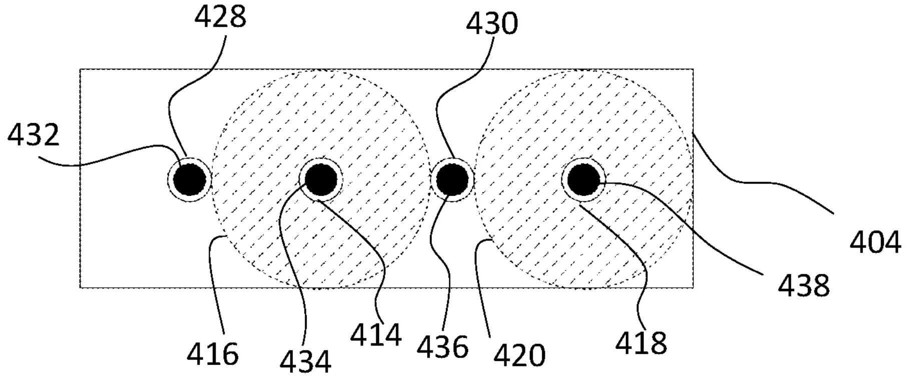
FIG. 4B is a representation of a second substrate of a current sensor assembly distributed across two substrates.
Figure 4C:
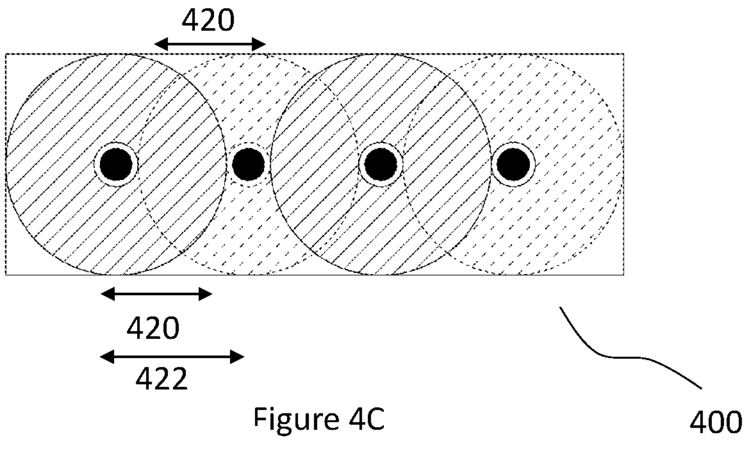
FIG. 4C is an overlayed representation of the first substrate of FIG. 4A and the second substrate of FIG. 4B.
Figure 5B:
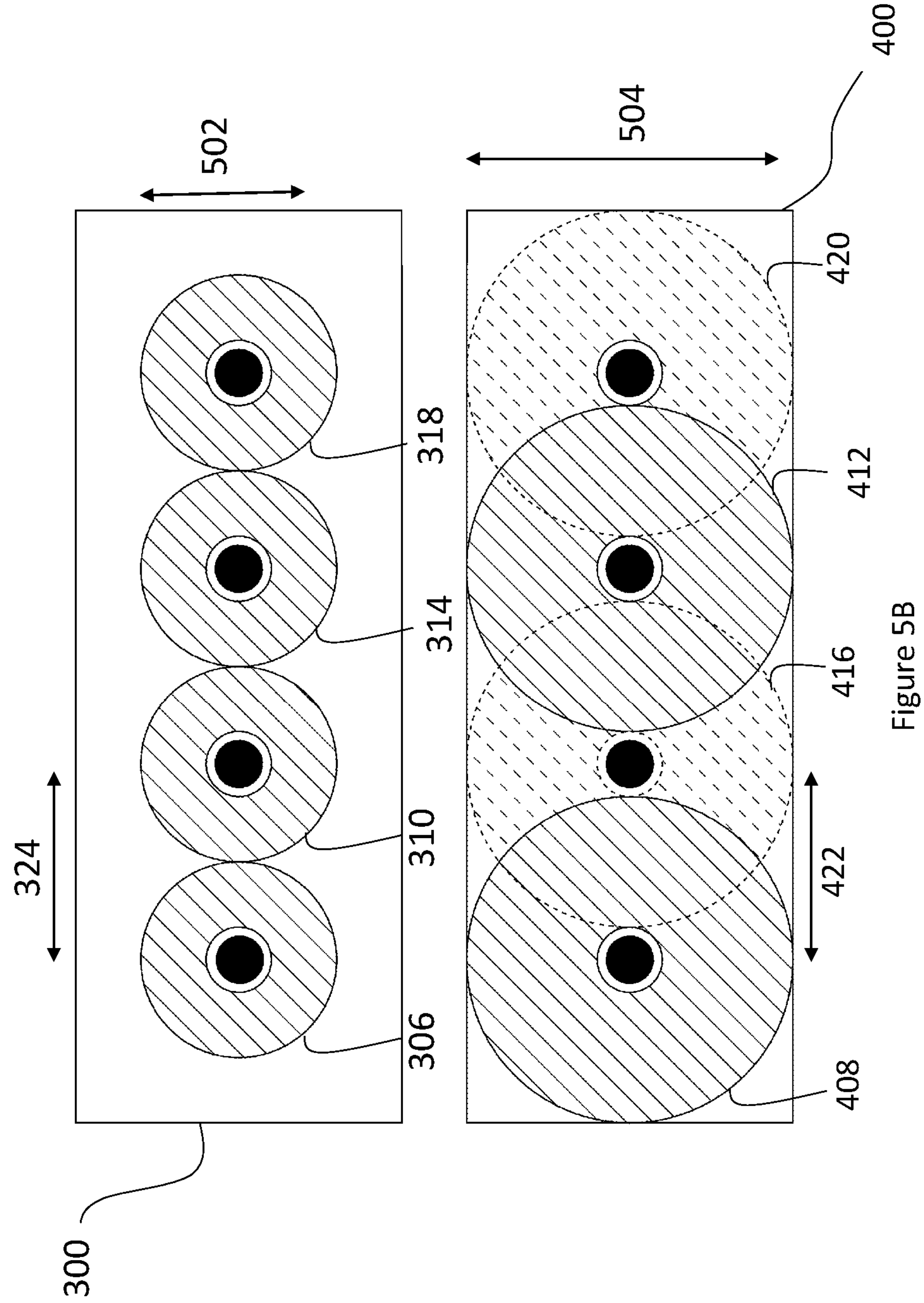
FIG. 5B is an alternative comparison of the current sensor of FIG. 3 and FIG. 4C.

For example, FIG. 5B shows the current sensor assembly 300 of FIG. 3 and the current sensor assembly 400 of FIG. 4C with pitch 324 between the current carrying conductors of the assembly 300 being the same as the pitch 422 between the current carrying conductors of the second assembly.

The radius 504 of the current measurement coils of the assembly 400 is significantly larger than the radius 502 of the current measurement coils of the assembly 300. This should increase current measurement sensitivity and accuracy for the same conductor pitch.

In the current measurement assembly 400 shown in FIG. 4, the current measurement coils may overlap when viewed from a direction normal to the surface of the substrates. For example, the first current measurement coil 408 overlaps with the third current measurement coil 416, the third current measurement coil 416 overlaps with the first measurement coil 408 and the second measurement coil 412, and the second current measurement coil 412 overlaps with the third measurement coil 416 and the fourth current measurement coil 420.

Whilst FIG. 4 shows a current sensor assembly 400 comprising four measurement coils, the current sensor assembly 400 may comprise more or fewer coils depending on the number of current carrying conductors. For example, the current sensor assembly 400 may comprise 3 measurement coils, including the first measurement coil 408, the second current measurement coil 412 and the third current measurement coil 416 (i.e., the fourth current measurement coil 420 may be excluded). A system such as this comprising three current measurement coils may be desirable in a three-phase system where measurement of the neutral conductor is not desired (or indeed if there is not neutral conductor). Further, the system may include only two current measurement coils, for example the first current measurement coil 408 and the third current measurement coil 416.

The holes 406, 410, 414, 418 are all surrounded by a respective current measurement coil. These holes 406, 410, 414, 418 are closed shapes, for example having a circular cross section, allowing a respective current measurement coil to be formed around the entirety of the respective hole.

The openings 424, 426, 428, 418 are not surrounded by current measurement coils, and instead are provided to allow a respective current carrying conductor to pass through the respective substrate. For example, the third current carrying conductor 434 passes through a first opening 424 on the first substrate 402 and a third hole 414 provided on the second substrate 404. Measurement of the current in the third current carrying conductor 434 may be performed using the third current measurement coil 416 on the second substrate 404. As the first opening 424 is not surrounded by a current measurement coil, there is greater flexibility in the form that the opening takes.

For example, whilst FIG. 4 shows all of the openings 424, 426, 428, 430 as closed shape holes (in this example, circular holes), any one or more of the openings 424, 426, 428, 430 may alternatively be cut-away openings. For example, one side of the opening may extend to an edge of the substrate such that the opening is a cut-away, which may allow a current carrying conductor to be easily inserted into the opening.

Figure 4D:
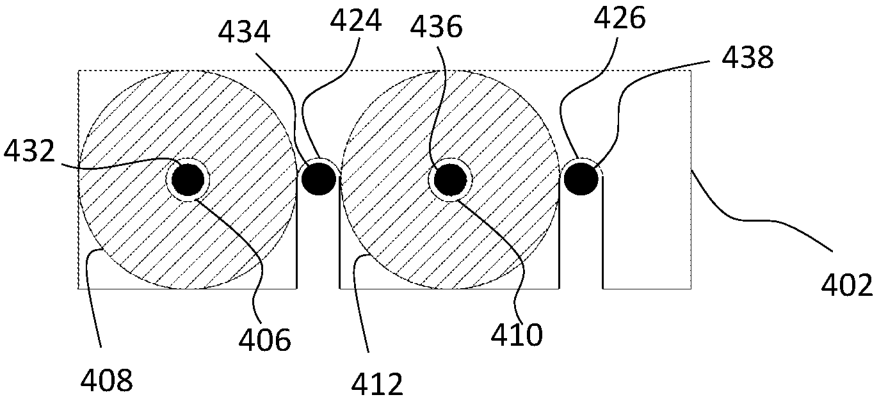
FIG. 4D is a representation of a first substrate of a current sensor assembly distributed across two substrates including cutaway sections.
Figure 4E:
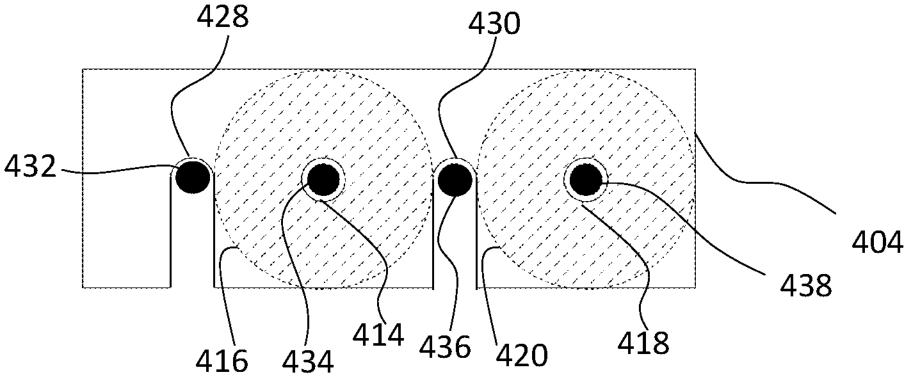
FIG. 4E is a representation of a second substrate of a current sensor assembly distributed across two substrates including cutaway portions.
Figure 4F:
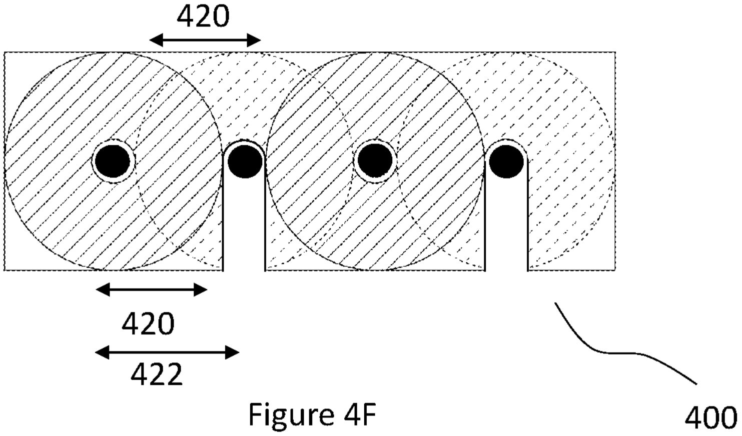
FIG. 4F is an overlayed representation of the first substrate of FIG. 4D and the second substrate of FIG. 4E.

FIGS. 4D to 4F show an example of this where each of the openings 424, 426, 428, 430 are cut-away, or open sided, openings. In this example each of the openings 424, 426, 428, 430 are the same, oblong shape, but any one or more of them may take any other suitable shape, for example with the opening being wider at the edge of the substrate than where the conductor passes through. In a further alternative, rather than the openings on the first substrate 402 extending to the same side as the openings on the second substrate 404, they may instead extend to opposing sides.

Figure 4G:
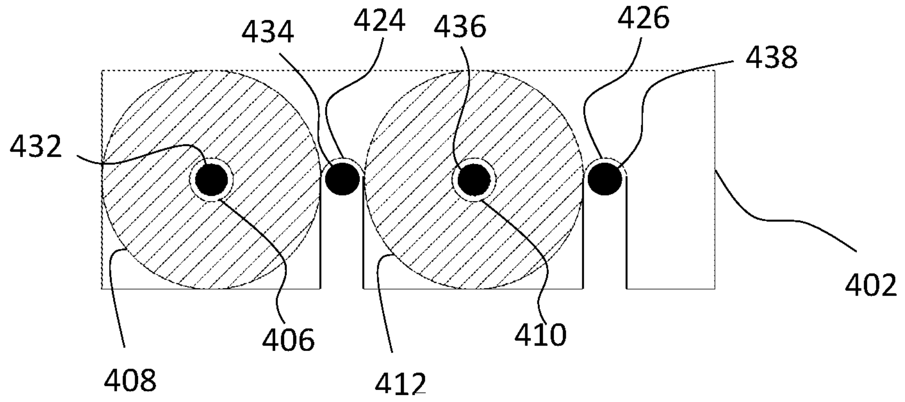
FIG. 4G is a representation of a first substrate of a current sensor assembly distributed across two substrates including cutaway sections.
Figure 4H:
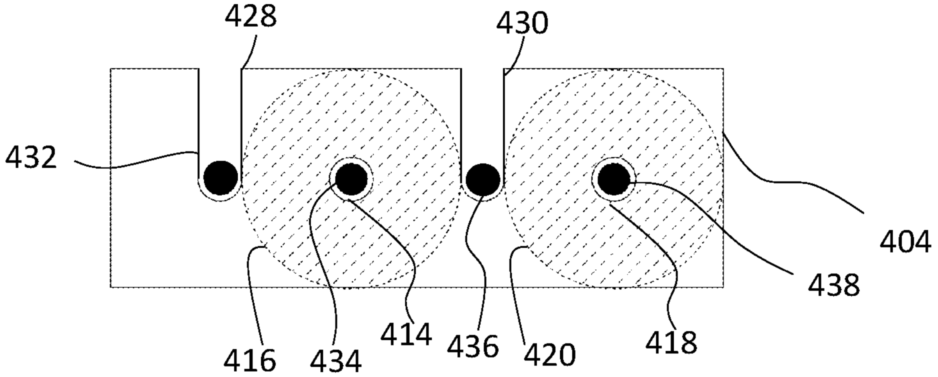
FIG. 4H is a representation of a second substrate of a current sensor assembly distributed across two substrates including cutaway portions.
Figure 4I:
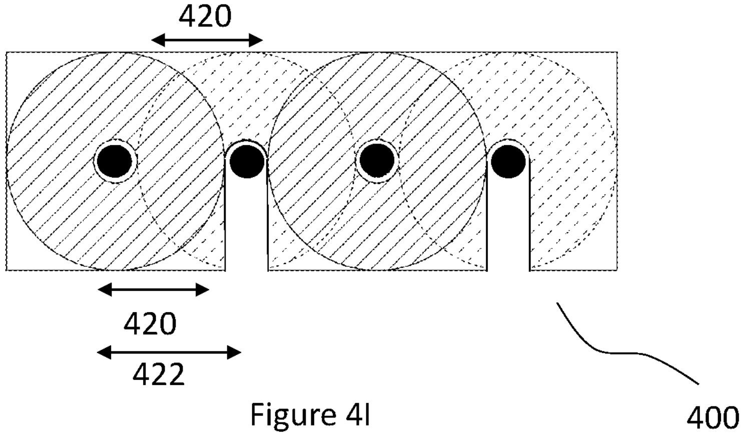
FIG. 4I is an overlayed representation of the first substrate of FIG. 4G and the second substrate of FIG. 4H.

FIGS. 4G to 4I show an example of this where the openings 424 and 426 extend to a first side of the first substrate 402 and the openings 428 and 430 extend to a second side of the second substrate 404, where the first and second sides are opposing sides. Such an arrangement may be particularly beneficial for manufacturing/assembly. In particular, the first current carrying conductor 432 and the second current carrying conductor 436 may be inserted into the first hole 406 and second hole 410 respectively, and the third current carrying conductor 434 and the fourth current carrying conductor 438 may be inserted into the third hole 414 and fourth hole 418 respectively. The first substrate 402 and second substrate 404 may then be brought into position with each other by sliding one on top of the other, such that the first current carrying conductor 432 and the second current carrying conductor 436 are slid into the fourth opening 428 and second opening 430 respectively, and at the same time the third current carrying conductor 434 and the fourth current carrying conductor 438 may be slide into the first opening 424 and the third opening 426 respectively. This benefit may also be realised in the alternative arrangement where the third opening 426 and fourth opening 432 are not present because shorter substrates are used so that the second coil 412 and third coil 416 reach the edges of their respective substrates (as described earlier). This first substrate 402 and the second substrate 404 of FIGS. 4G and 4F may be seen as the same substrate rotated through 180 degrees. This may reduce manufacturing complexity as only a single substrate type needs to be manufactured.

In all of the examples given above, the current sensor assembly 400 includes multiple current measurement coils on each substrate. This may reduce the inter-board connections or interconnects required, compared to having a separate substrate for each current measurement coil. A smaller number of inter-board connections may reduce assembly/manufacturing complexity and/or reduce the electromagnetic pickup experienced by the current measurement circuit, which should reduce noise in the measurement signals and therefore improve the accuracy of the current measurement signals output by the current measurement coils.

Figure 6:
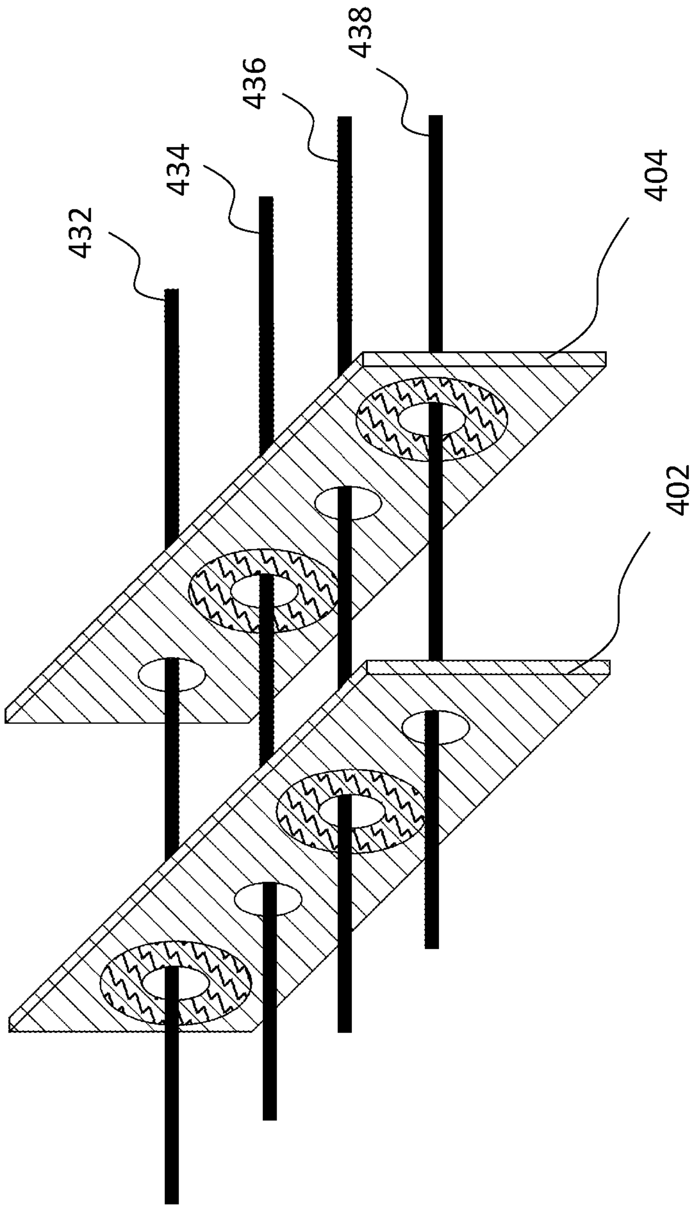
FIG. 6 is an alternative view of the current sensor assembly of FIG. 4C.

FIG. 6 shows an alternative view of the current sensor assembly 400, particularly of the current assembly 400 represented in FIGS. 4A to 4C (although it will be appreciated that the relative arrangement of the two substrates would be the same for the alternatives represented in FIGS. 4D to 4I). The current sensor assembly comprises four current carrying conductors 432, 434, 436, and 438. The first substrate 402 and the second substrate 404 are arranged such that the major surfaces of the substrates are parallel, or substantially parallel, to each other. Whilst FIG. 4 shows a gap between the first substrate 402 and the second substrate 404, the substrates may alternatively be arranged to be in close contact with each other such that there is no gap between the first substrate 402 and the second substrate 404.

Whilst the current sensor assembly 400 of FIG. 4 includes a substrate with two measurement coils and an opening between them suitable for one current carrying conductor, the first substrate may be arranged differently.

Figure 7:
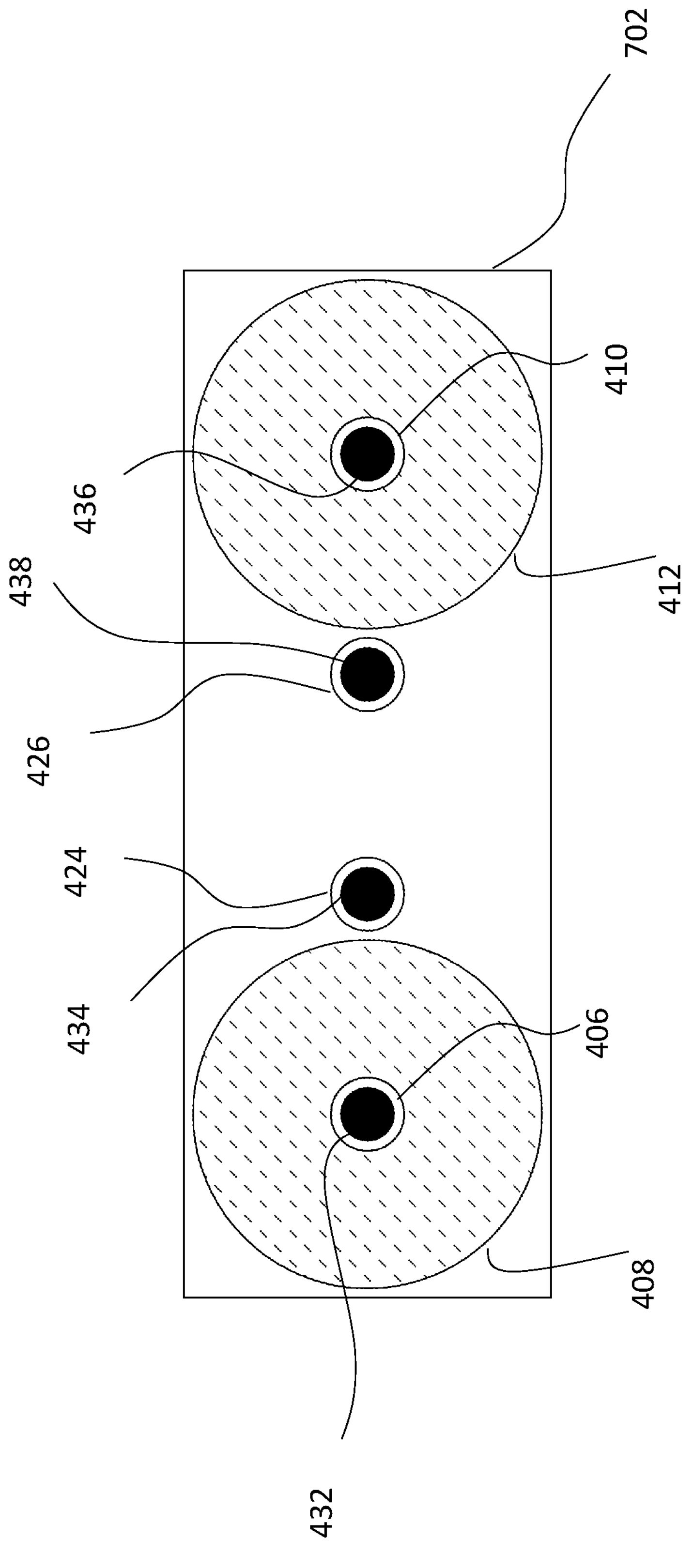
FIG. 7 is an alternative substrate that may be used in place of the first substrate of FIG. 4A.

FIG. 7 shows an example of a first substrate 702 with an alternative arrangement.

Similarly to the first substrate 402 examples above, the first substrate 702 represented in FIG. 7 comprises a first hole 406. The first hole 406 is sized such that it is capable of receiving the first current carrying conductor 432 at an angle normal to the surface of the first substrate 402. The first current measurement coil 408 is formed on the first substrate 402 around a circumference of the first hole 406.

Again, similarly to the first substrate 402 examples above, the first substrate 702 represented in FIG. 7 further comprises a second hole 410. The second hole 410 is sized such that is capable of receiving the second current carrying conductor 436 at an angle normal to the surface of the first substrate 702. The second current measurement coil 412 is formed on the first substrate 702 around the circumference of the second hole 410.

The first opening 424 is again located between the first hole 406 and the second hole 410. The first opening 424 is capable of receiving the third current carrying conductor 434 at an angle normal to the surface of the first substrate 702. However, in contrast to the earlier examples of the first substrate 402, in arrangement represented in FIG. 7 the third opening 426 is located on the first substrate 702 between the first hole 406 and the second hole 410. The third opening is capable of receiving the fourth current carrying conductor 438 at an angle normal to the surface of the first substrate 402.

Whilst the first opening 424 and the third opening 426 are shown as separate openings in this example, these openings may instead by combined into a single first opening 424 which is capable of receiving both the third current carrying conductor 434 and the fourth current carrying conductor 438. For example, it may be an elongated hole in the first substrate 702 so that both the third current carrying conductor 434 and the fourth current carrying conductor 438 pass through the same hole.

Figure 8:
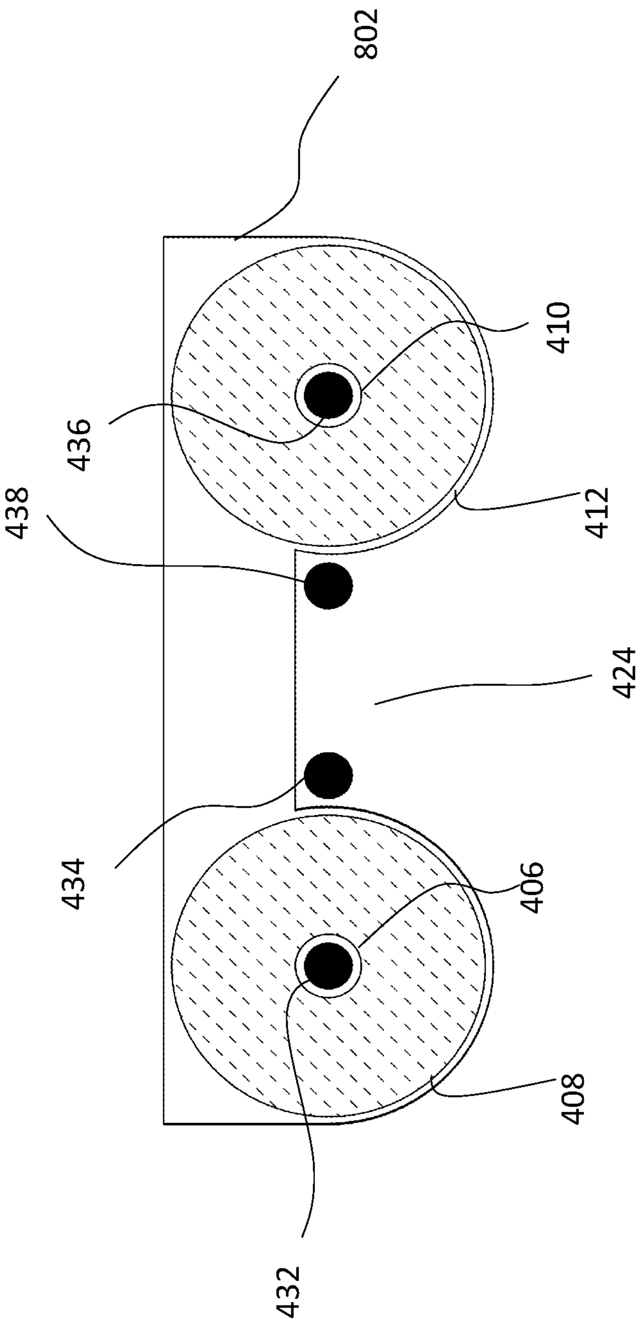
FIG. 8 is an alternative substrate that may be used in place of the first substrate of FIG. 4A.

As is shown in FIG. 8, the first opening 424 may be implemented using a cut-away portion, such that the third current carrying conductor 434 and the fourth current carrying conductor 438 both pass through the first opening 424. This may simplify the construction of the current sensor assembly, as the third current carrying conductor 434 and the fourth current carrying conductor 438 may brought into position more easily compared with inserting them into an opening(s) that is formed as a closed sided hole.

FIG. 9 shows a current sensor assembly 900 comprising multiple substrates, with the current measurement coils divided between across the substrates. FIG. 9*a* shows the first substrate 702 viewed from a direction normal to the surface of the substrate (although the first substrate 802 represented in FIG. 8 may alternatively be used). FIG. 9*b* shows a second substrate 904 viewed from a direction normal to the surface of the substrate. FIG. 9*c* shows a third substrate 906 viewed from a direction normal to the surface of the substrate. FIG. 9*d* shows a view of the first, second and third substrates arranged such that they are stacked, the view being from a direction that is normal to the surface of the substrates.

The second substrate 904 comprises the third hole 414. The third hole 414 is sized such that it is capable of receiving the third current carrying conductor 434 at an angle normal to the surface of the second substrate 904. The third current measurement coil 416 is formed on the second substrate 404 around the circumference of the third hole 414.

The third substrate 906 comprises the fourth hole 418. The fourth hole 418 is sized such that it is capable of receiving the fourth current carrying conductor 438 at an angle normal to the surface of the third substrate 906. The fourth current measurement coil 420 is formed on the third substrate 906 around the circumference of the fourth hole 418.

The second substrate 904 and the third substrate 906 each comprise only a single measurement coil each. As such, the substrates may have a circular cross-section to minimise their size, although they could alternatively be any other shape.

Figure 9A:
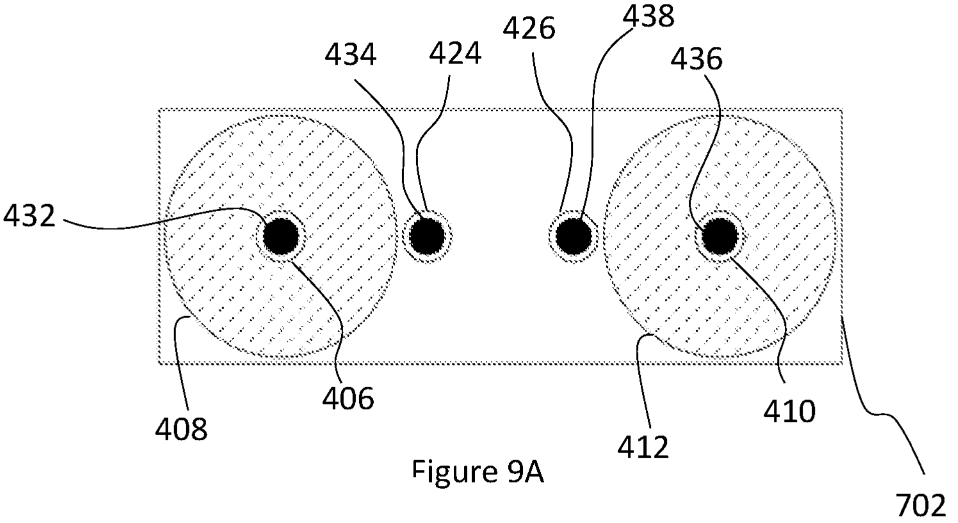
FIG. 9A is a representation of a first substrate of a current sensor assembly distributed across three substrates.
Figure 9B:
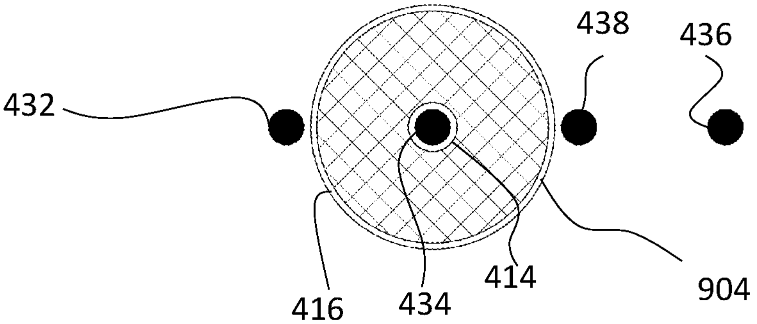
FIG. 9B is a representation of a second substrate of a current sensor assembly distributed across three substrates.
Figure 9C:
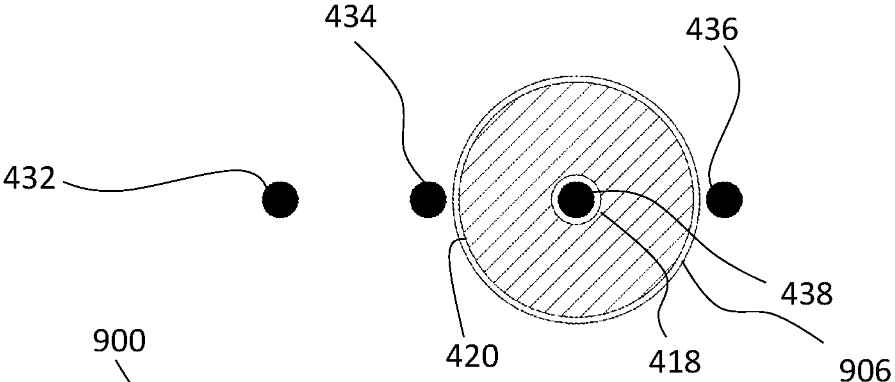
FIG. 9C is a representation of a third substrate of a current sensor assembly distributed across three substrates.

FIGS. 9B and 9C show the positions of the second substrate 904 and the third substrate 906 relative to the positions of the current carrying conductors 432, 434, 436, 438. As the second and third substrates include only a single measurement coil each, the substrates do not need openings for the conductors which they are not measuring since these conductors may be positioned to the side of the second substrate 904 and the third substrate 906.

Figure 9D:
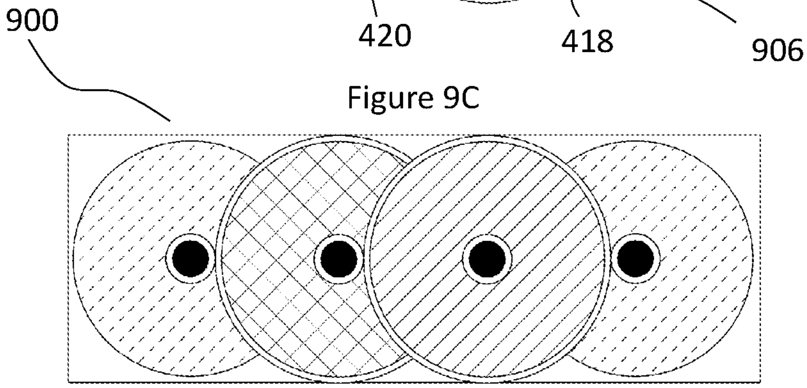
FIG. 9D is an overlayed representation of the first substrate of FIG. 9A, the second substrate of FIG. 9B and the third substrate of FIG. 9C.

FIG. 9D shows the current sensor assembly 900 with the second substrate 904 and the third substrate 906 both positioned on top of the same side of the first substrate 902. However, the second substrate 904 may be provided on the first side at the first substrate 402 and the third substrate 906 may be provided on a second side with the first substrate 402, such that the first substrate 402 is sandwiched between the second substrate 904 and third substrate 906.

Whilst the third current measurement coil 416 and the fourth current measurement coil 420 are shown on two separate substrates 904, 906, they may instead be provided on a single substrate. To accommodate both current measurement coils 416, 420 on the same substrate the radius of this third current measurement coil 416 and the fourth current measurement coil 420 may be reduced. Alternatively, the third hole 414 on the second substrate 904 may be increased in size to allow the third current carrying conductor 434 to be off centre in the hole 414. Further, the fourth hole 418 on the third substrate 906 may be increased in size to allow the fourth current carrying conductor 438 to be off centre in the hole 418. This may allow the current measurement coils 416 and 420 to have the same radius as the current measurement coils shown in FIGS. 9B and 9C. A more detailed implementation of the current carrying conductors being off centre in the holes is shown in FIG. 20.

Whilst FIG. 9 shows four current carrying conductors 432, 434, 436 and 438 and three substrates 702, 904 and 906, in an alternative there may be only three current carrying conductors (for example 432, 434 and 436) and only two substrates (for example 702 and 904). In this example, the third current carrying conductor 434 may be positioned anywhere between the first current carrying conductor 432 and second current carrying conductor 434, for example equidistant between them.

The current carrying conductors are depicted in all of the preceding examples as having circular cross-sections. However, depending on the use-case, the current carrying conductors may have alternative cross-sections or cross-sections that vary along the length of the conductor.

Figure 10A:
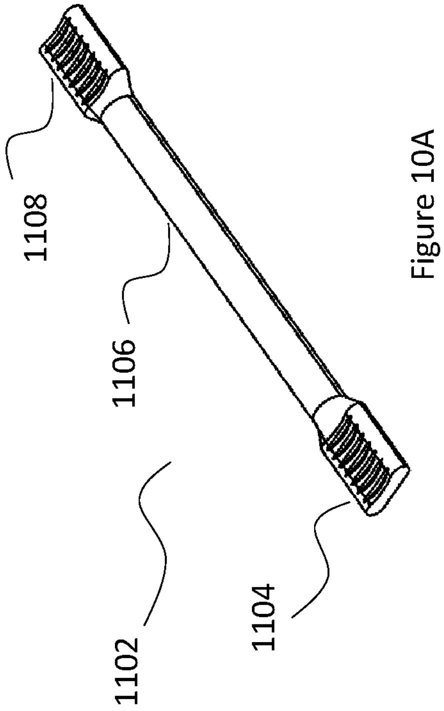
FIG. 10A is a representation of a first current carrying conductor.

FIG. 10A shows a current carrying conductor 1102. A first end of the current carrying conductor 1102 has a first cross section 1104. A central section of the current carrying conductor 1102 has a second cross section 1106. A second end of the current carrying conductor 1102 has a third cross section 1108.

Figure 10B:
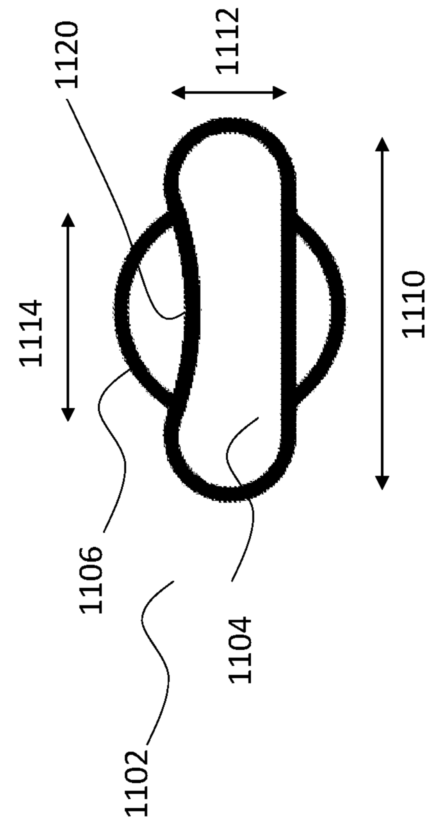
FIG. 10B is an alternative view of the current carrying conductor of FIG. 10A.

The first cross section 1104 and the third cross section 1108 maybe oblong cross sections. As shown in FIG. 10B, the length 1110 of the oblong cross section is greater than the width 1112 of the oblong cross section. Further, the first cross section 1104 may include a concave surface 1120 along one side of the length 1110. This may allow easier connection of the current carrying conductor 1102 to a terminal block, as a screw or connection pin may easily secure the oblong cross section. The second cross section 1106 may be a circular cross section with a diameter 1114 which is less than the length 1110 of the oblong cross section.

Figure 10C:
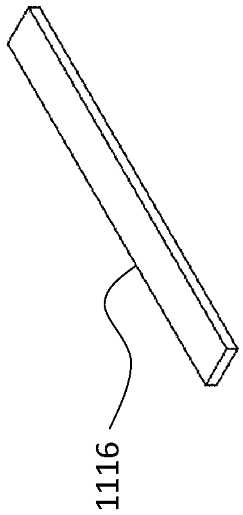
FIG. 10C is a representation of a second current carrying conductor.
Figure 10D:
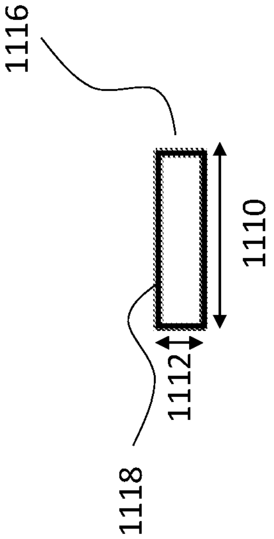
FIG. 10D is an alternative view of the current carrying conductor of FIG. 10C.

Alternatively, as shown in FIG. 10C and FIG. 10D, the current carrying conductor 1116 may have a rectangular or oblong cross section 1118 throughout the entire length of the current carrying conductor 1116 with a first length 1110, and a first width 1112 that is less than the first length 1110.

The holes and openings in the previously described current sensor assemblies for receiving the current carrying conductor are sized to accept the current carrying conductors at an angle normal to the surface of the substrate. As such, the shape of the holes and openings may vary depending on the shape of the current carrying conductor being used. Whilst two different types of current carrying conductor are shown in FIG. 10, current carrying conductors with alternative cross sections may also be used.

Figure 11A:
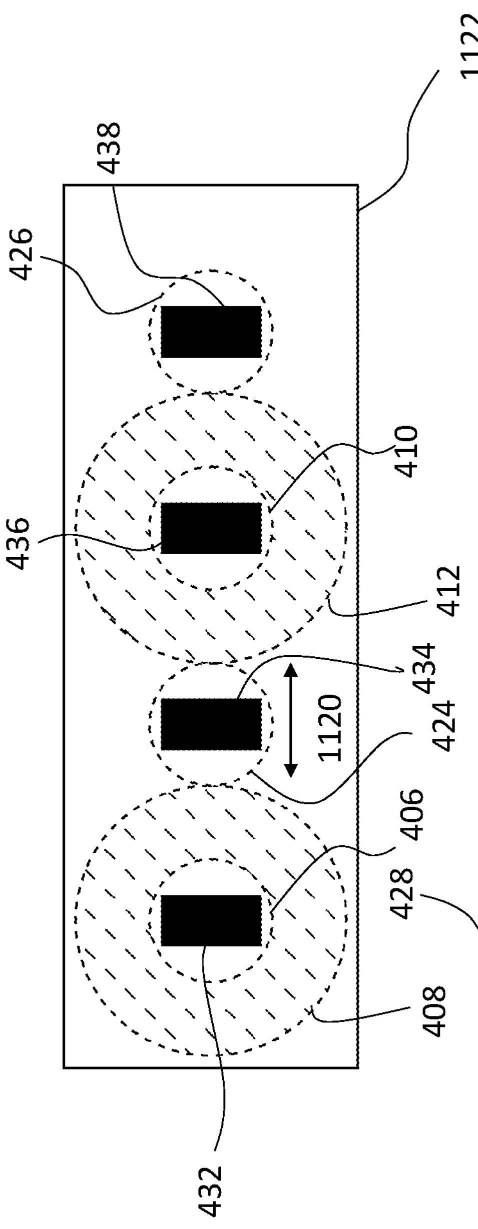
FIG. 11A is a view of a first substrate of a current sensor assembly.
Figure 11B:
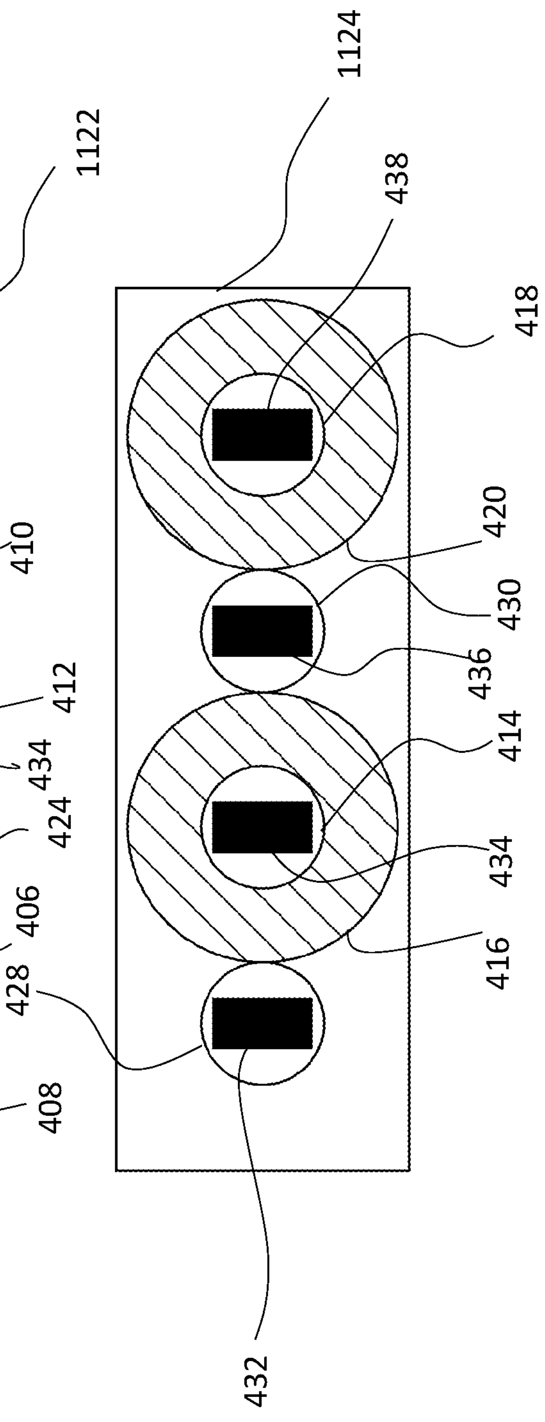
FIG. 11B is view of a second substrate of a current sensor assembly.

FIGS. 11A and 11B show a further alternative example of a current sensor assembly in accordance with an aspect of the disclosure. In this example, FIG. 11A shows a first substrate 1122 that is very similar to the first substrate 402 described in the earlier examples and FIG. 11B shows a second substrate 1124 that is very similar to the second substrate 404 that is described in earlier examples. The current carrying conductors 432, 434, 436 and 438 in the example of FIGS. 11A and 11B have oblong cross sections, at least at a first end and in some cases throughout the entire length of the conductor. The holes 406, 410, 414 and 418 around which current measurement coils are formed are circular, allowing the current carrying conductors to pass through. The openings 424, 426, 428 and 430 in this example are also circular. However, the openings in this example are larger than in previous examples in order to accommodate the oblong cross sections of the current carrying conductors 432, 434, 436 and 438. Consequently, the radius of the coils is smaller than in previous examples. For example, the first current measurement coil 408 on the first substrate 1122 and the second current measurement coil 412 on the first substrate 1122 are separated by a distance 1120 which is equal to at least the diameter of the first opening 424.

Figure 12A:
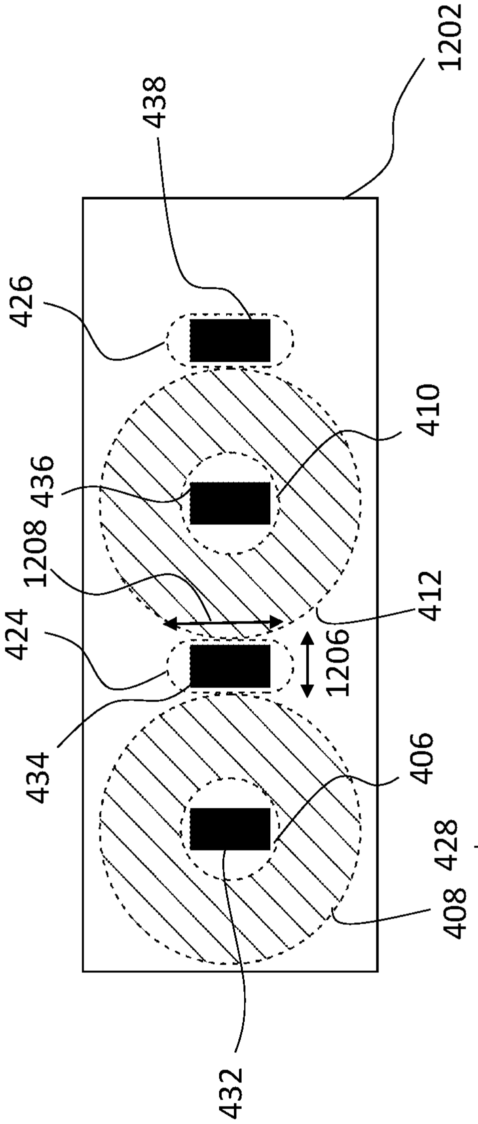
FIG. 12A is a view of a first substrate of a current sensor assembly with modified openings.
Figure 12B:
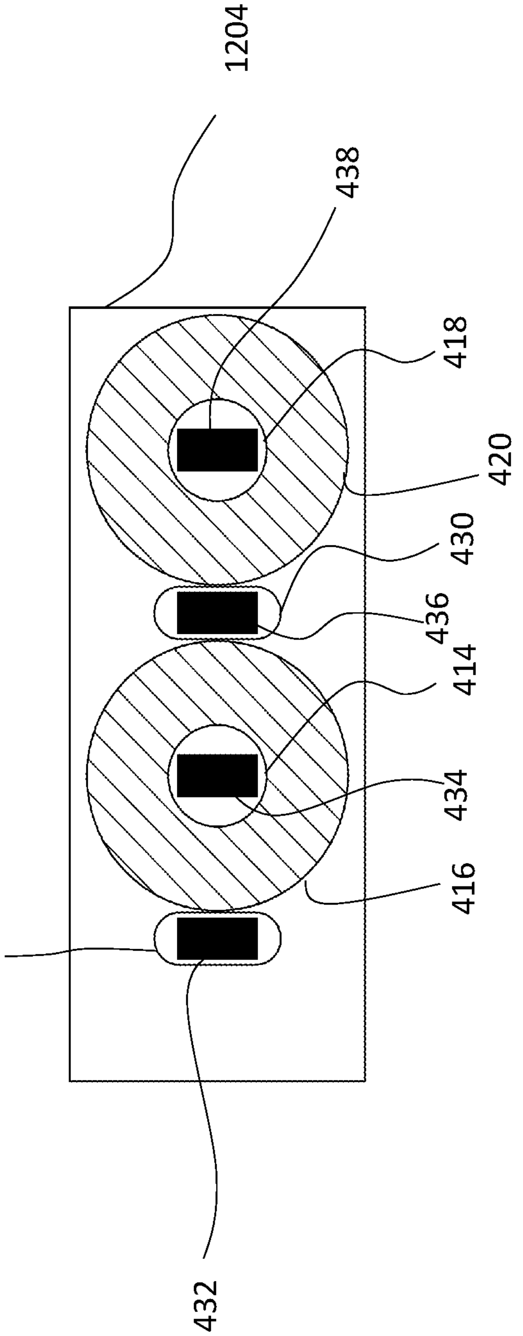
FIG. 12B is view of a second substrate of a current sensor assembly with modified openings.

However, it has been recognised by the inventors that the shape of the openings 424, 430 in the substrates may be altered to reduce the distance 1120 between the current measurement coils. FIGS. 12A and 12B show a first substrate 1202 and a second substrate 1204 where the openings 424, 426, 428 and 430 have an oblong cross section. The openings have a width 1206 and a length 1208. The width 1206 is less than the length 1208. In this way, a current carrying conductor 434 with an oblong cross section, such as the current carrying conductor 1116 of FIG. 10, may pass through the opening 424. The width 1206 of the opening is greater than the width 1112 of the current carrying conductor, and the length 1208 of the opening 424 is greater than the length 1110 of the current carrying conductor. However, the width 1206 of the opening is less than the length 1208 of the opening. In this way, the first current measurement coil 408 and the second current measurement coil 412 may be closer together than in the example of FIG. 11, separated by a distance equal to or greater than the width 1206 of the first opening 424 rather than being a distance equal to or greater than the length 1208 of the first opening 424. As can be seen in FIG. 12B, the openings 428 and 430 in the second substrate 1204 are similarly arranged. As a result, the radius of the coils in the example of FIG. 12 may be made larger than in the example of FIG. 11, which may improve the current measurement performance of the coils.

Where the current carrying conductor 434 has a uniform oblong cross section throughout its length, as in the current carrying conductor 1116 of FIG. 10, the shape of the openings are determined only by the oblong cross section of the current carrying conductor. However, where the current carrying conductor has a varying cross section throughout its length, as in the current carrying conductor 1102 of FIG. 10, it may be necessary to size the openings such that they may accommodate all of the cross sections of the current carrying conductor.

Figure 13A:
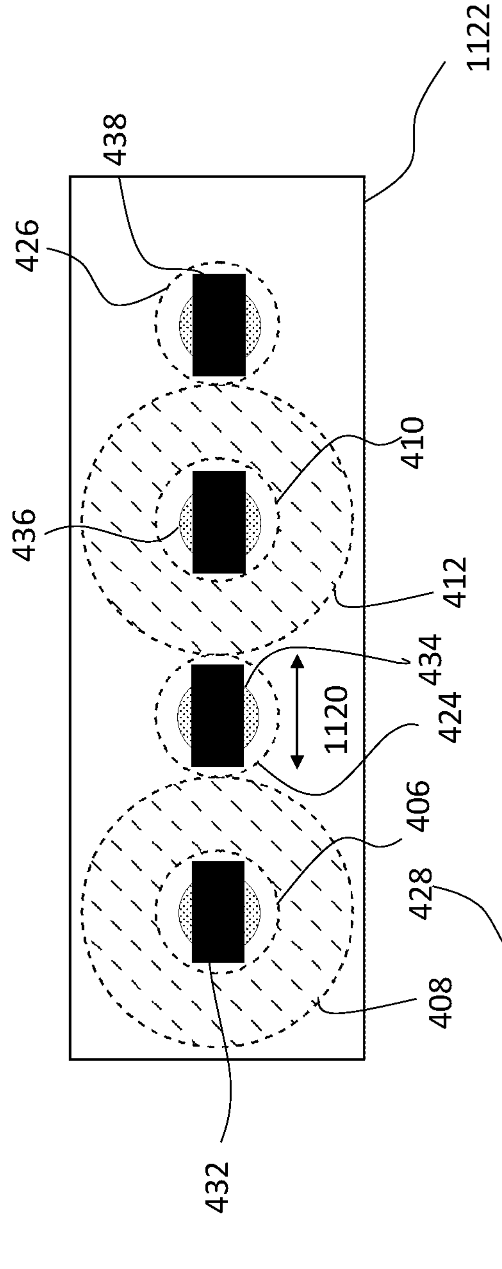
FIG. 13A is a view of a first substrate of a current sensor assembly showing the cross sections of the current carrying conductors.
Figure 13B:
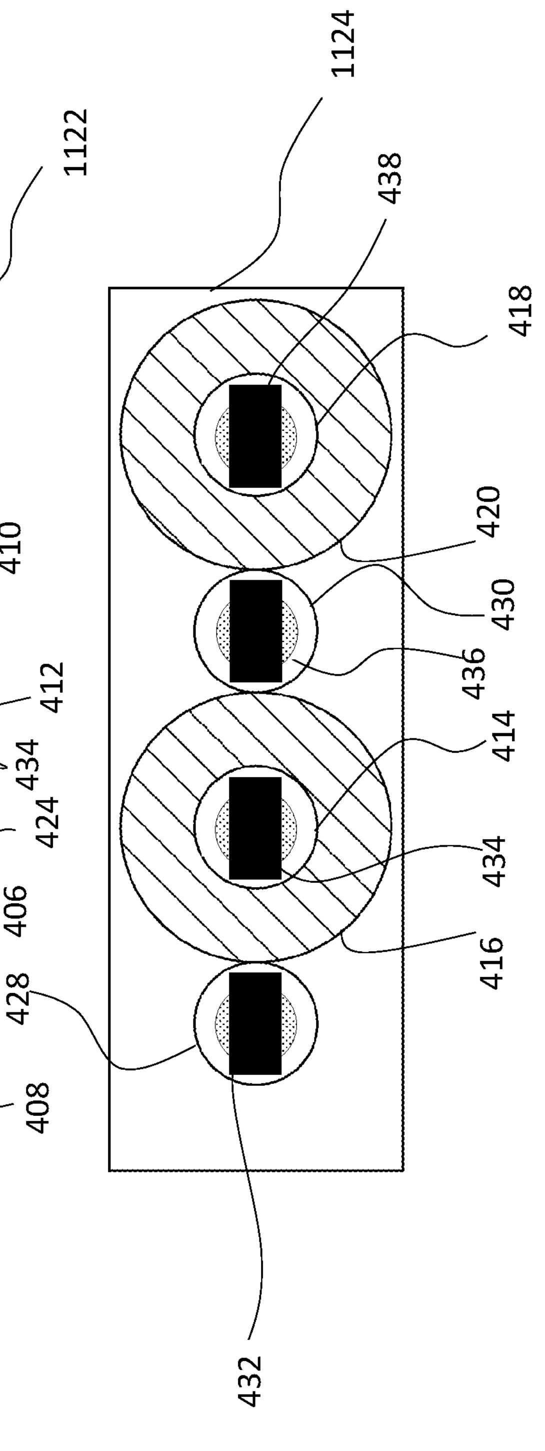
FIG. 13B is a view of a second substrate of a current sensor assembly showing the cross sections of the current carrying conductors.

FIGS. 13A and 13B show a view of a first substrate 1122 and a second substrate 1124 that is very similar to that represented in FIGS. 11A and 11B. However, in this example, the current carrying conductors 432, 434, 436 and 438 have a shape that corresponds to that shown in FIGS. 10A and 10B. In this example, the current carrying conductors 432, 434, 436 and 438 are oriented so that the long dimension 1110 of their first ends 1104 are all aligned with each other, which may be a requirement of the conductor fixings (for example the terminal block) to which the current carrying conductors 432, 434, 436 and 438 may all need to be attached. Such an orientation may be more readily appreciated from FIGS. 14 to 17, and particularly FIG. 17 which shows a terminal block. In order to allow the length dimension 1110 of the ends of the current carrying conductors 432, 434, 436 and 438 to pass through the substrates 1122 and 1124, the openings 424, 426, 428 and 430 have a relatively large width 1120 and so the radius of the coils 408, 412, 416 and 420 is relatively small.

However, the inventors have recognised that if, when the carrying conductors 432, 434, 436 and 438 are being inserted through the substrates 1122 and 1124, the orientation of each is rotated by 90 degrees around their primary axis, the openings 424, 428, 432 and 436 may be made less wide. As such, dimension 1120 of each of the openings may be reduced and, as such, the radius of each of the coils may be increased, thereby improving the measurement accuracy of the coils.

Figure 13C:
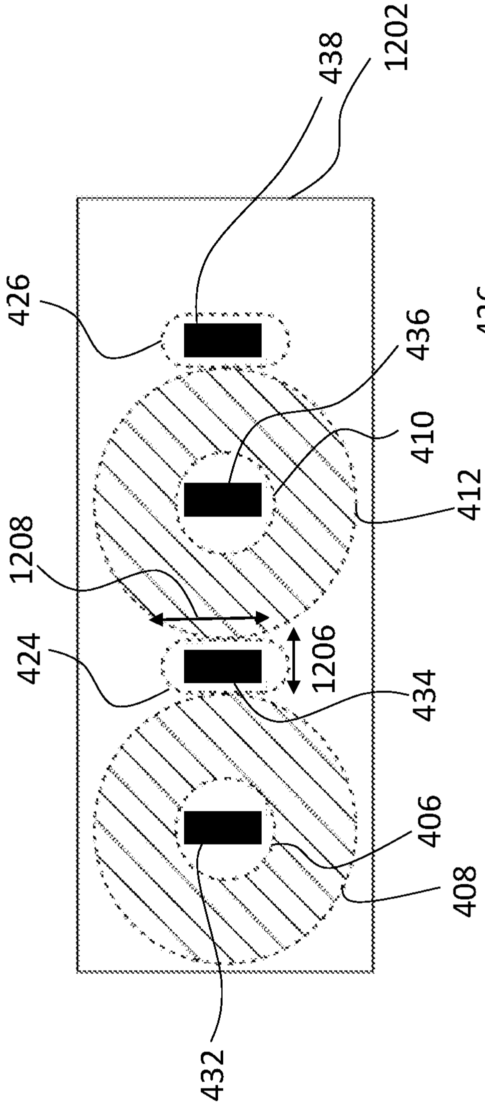
FIG. 13C is a view of a first substrate of a current sensor assembly showing the positioning of a first cross section of a current carrying conductor.
Figure 13D:
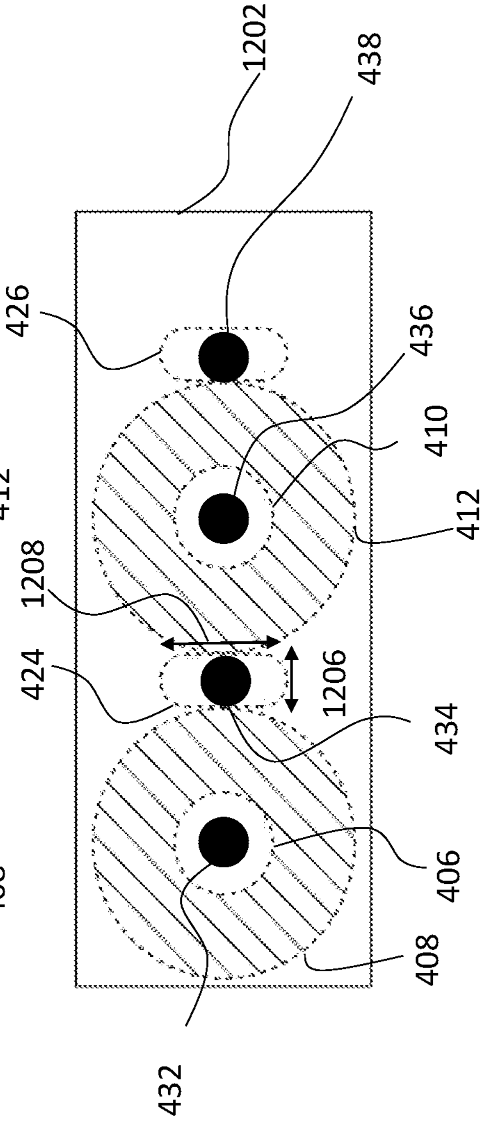
FIG. 13D is a view of a first substrate of a current sensor assembly showing the positioning of a second cross section of a current carrying conductor.

FIG. 13C shows a first view of the first substrate 1202 in accordance with an example of this. FIG. 13D shows a second view of the first substrate 1202. The current carrying conductors have the same shape as those of FIGS. 10A, 10B, 13A and 13B. Just the first cross section (i.e., the oblong cross section) that is at an end of the current carrying conductors is represented in the first view of FIG. 13C. Just the second cross section (i.e., the circular cross section) at a central portion of the current carrying conductors is represented in the second view of FIG. 13D.

As is shown in FIG. 13C, the first opening 424 has width 1206 that is greater than the width 1112 of the first cross section of the third current carrying conductor 434 and a length 1208 that is greater than a length 1110 of the first cross section. Further, as is shown in FIG. 13D, the first opening has a width 1206 which is greater than a diameter 1114 of the second cross section. The width 1206 of the first opening is less than the length 1114 of the first cross section. The third current carrying conductor 434 may be passed through the opening in one orientation, with the length 1110 of the first cross section in the same direction as the length 1208 of the first opening 424. This is the orientation that is represented in FIG. 13C. Once the first oblong cross section 1104 has been passed through the opening 424, the current carrying conductor may be rotated about its principle axis (eg, rotated by, for example, about 90 degrees clockwise or anticlockwise about the main or principle axis of the conductor, which is the axis going directly into the page from the perspective of FIGS. 13C and 13D) if desired, as the opening can accommodate the circular cross section 1106 of the current carrying conductor 434 in any orientation. In this way, the first current measurement coil 408 and the second current measurement coil 412 may be closer together than would otherwise be possible. Consequently, the orientation of conductors represented in FIGS. 13A and 13B may be achieved with an opening with width 1206, which is smaller than the width 1120 in the examples of FIGS. 13A and 13B, meaning that the first current measurement coil 408 and second current measurement coil 412 may be made larger and therefore more accurate. A further benefit of the shape of the opening 424 in FIGS. 13C and 13D is that the ends of the current carrying conductor 1102 may be flattened to form the shape represented in FIGS. 10A and 10B prior to being inserted into the first and second substrates, whilst still achieving the relatively small width 1206. This is in contrast to manufacturing processes where a design such as that represented in FIGS. 4A to 4C is used, and where a circular cross-section rod is inserted through the openings in the substrates and then the ends subsequently flattened. Such a manufacturing process is more complex and represents a greater risk of damaging the substrates and/or other electronics since the equipment for flattening the ends of the conductor rods is typically very heavy and powerful. The same arrangement is true for the other openings on the first substrate and the second substrate. For example, the second opening 430 between the third current measurement coil 416 and the fourth current measurement coil 420 may have the same dimensions as the opening 424 between the first current measurement coil 408 and the second current measurement coil 412.

Whilst the openings 424 and 426 are represented in FIGS. 13C and 13D as closed sided holes, in an alternative they may be cut-away openings such as the examples of FIGS. 4D to 4F. In this case, the cut-away openings may be of any suitable shape (as explained with reference to FIGS. 4D to 4F), but the part of the opening that is between the measurement coils 408 and 412 will have a width 1206 that is sufficient to accommodate the circular cross-section of the current carrying conductors, but not the oblong cross section in the orientation shown in FIGS. 13A and 13B, in order to minimise the width 1206.

Figure 14:
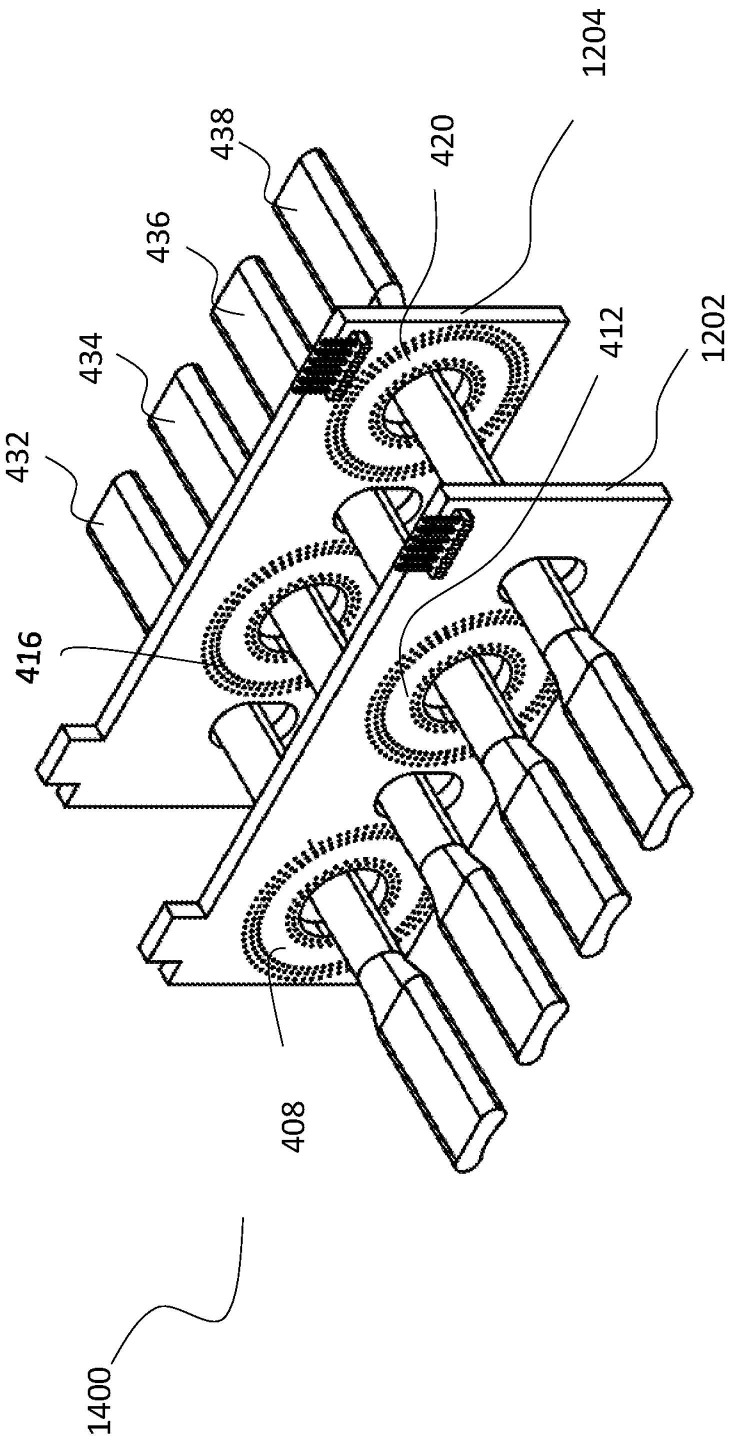
FIG. 14 is 3D of the current sensor assembly of FIGS. 12A and 12B.

FIG. 14 shows a 3D view of a current sensor assembly 1400, including the first substrate 1202 and a second substrate 1204 having the design shown in FIGS. 13C and 13D. The assembly process of aligning the orientation of the current carrying conductors 432-438 with the openings in the two substrates so that they can be inserted through the holes and openings in the two substrates, and then rotating them about their principle axis, for example by about 90 degrees clockwise or anticlockwise, to their second, final orientation so that they can be connected to the terminal blocks 1702, 1704, 1706 and 1708, may be readily appreciated from this 3D view.

Figure 15:
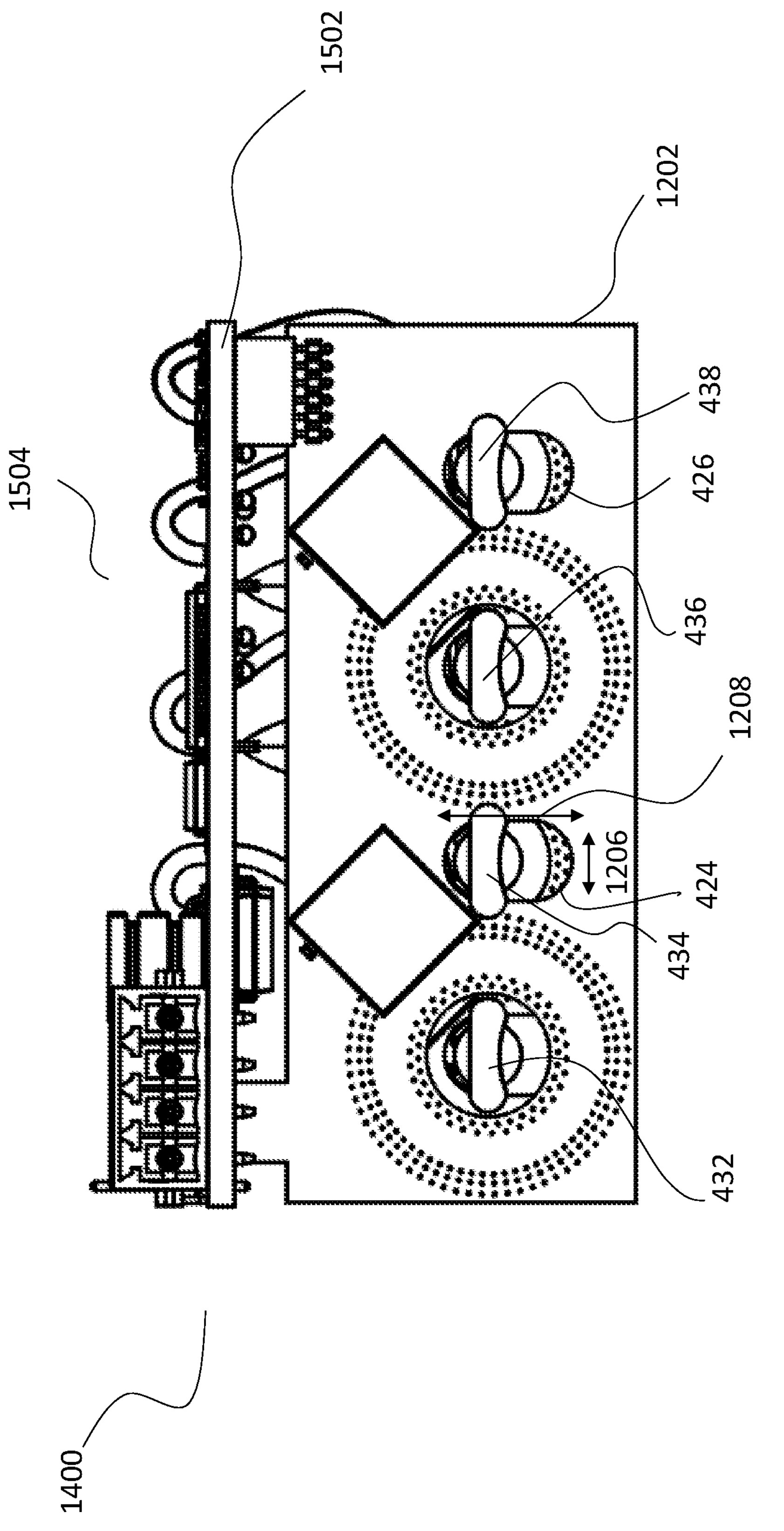
FIG. 15 is an alternative view of the current sensor assembly of FIG. 14. further including an additional substrate.

FIG. 15 shows an alternative view of the current sensor assembly 1400. In this example, a further PCB 1502 is coupled to the top of the first substrate 1202 and the second substrate 1204.

As can be seen from FIG. 15, the current carrying conductors have a first oblong cross section at their end. The current carrying conductors may be the same as those shown in FIGS. 10A and 10B. As outlined previously, the first opening 424 also has an oblong cross section. As such, the third current carrying conductor 434 may fit through the first opening 424 during manufacture/assembly in only certain orientations, as explained earlier. In particular, the third current carrying conductor 434 may fit through the first opening 424 only in an orientation where the longer edge 1110 of the third current carrying conductor 434 is aligned with a longer edge 1208 of the first opening 424. Once the third current carrying conductor 434 has been passed through the first opening 424 in such an orientation, it may be rotated 90 degrees such that it is easier to connect to associated terminal blocks. The same is true for the other current carrying conductors.

Figure 16:
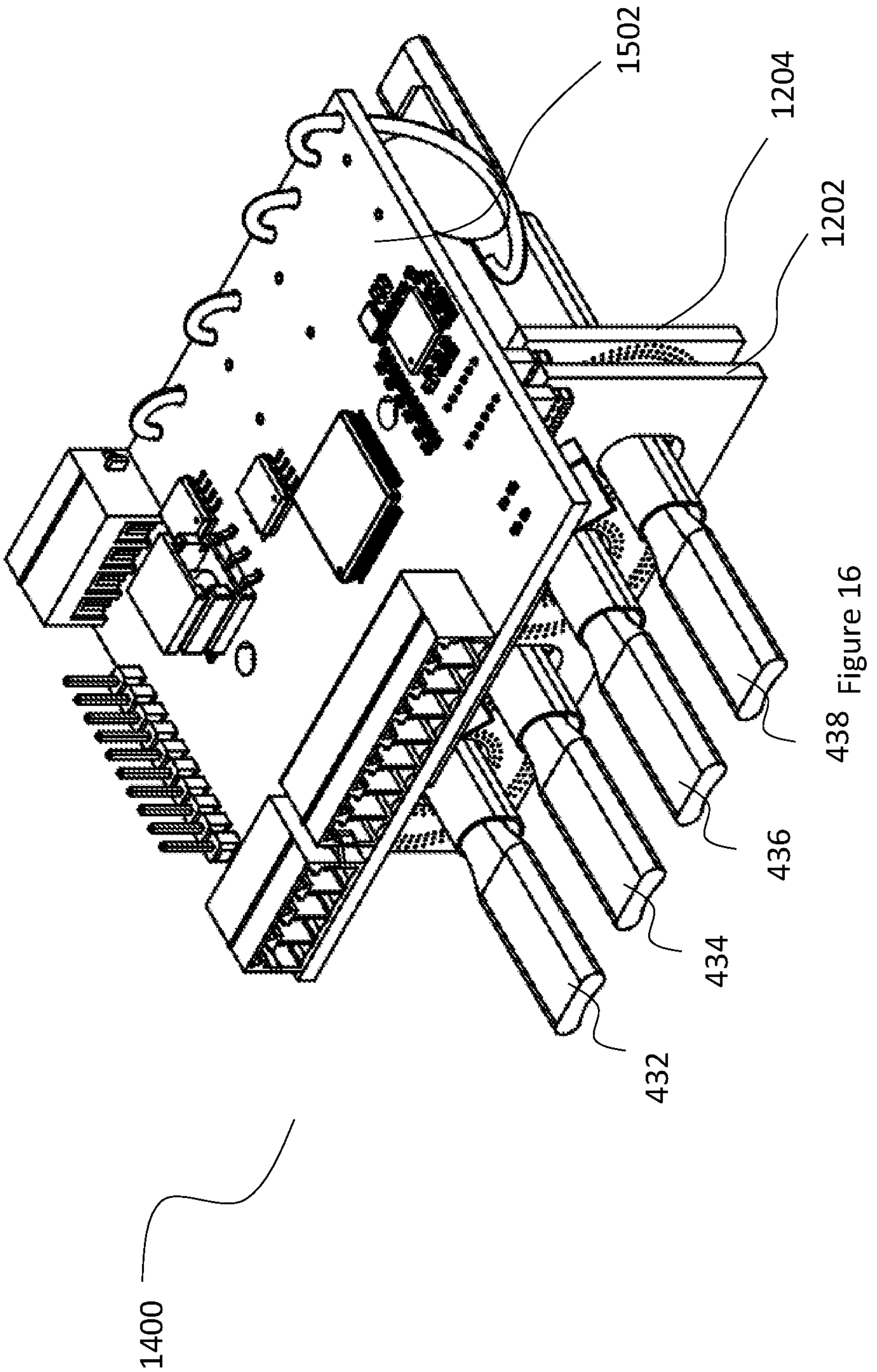
FIG. 16 is an alternative view of the current sensor assembly of FIG. 15.

FIG. 16 shows an alternative view of the current sensor assembly of FIG. 15, showing the relative positions of the first substrate 1202 and the second substrate 1204, with the first 432, second 436, third 434 and fourth 438 current carrying conductors passing through respective current measurement coils on the first substrate 1202 and the second substrate 1204.

Figure 17:
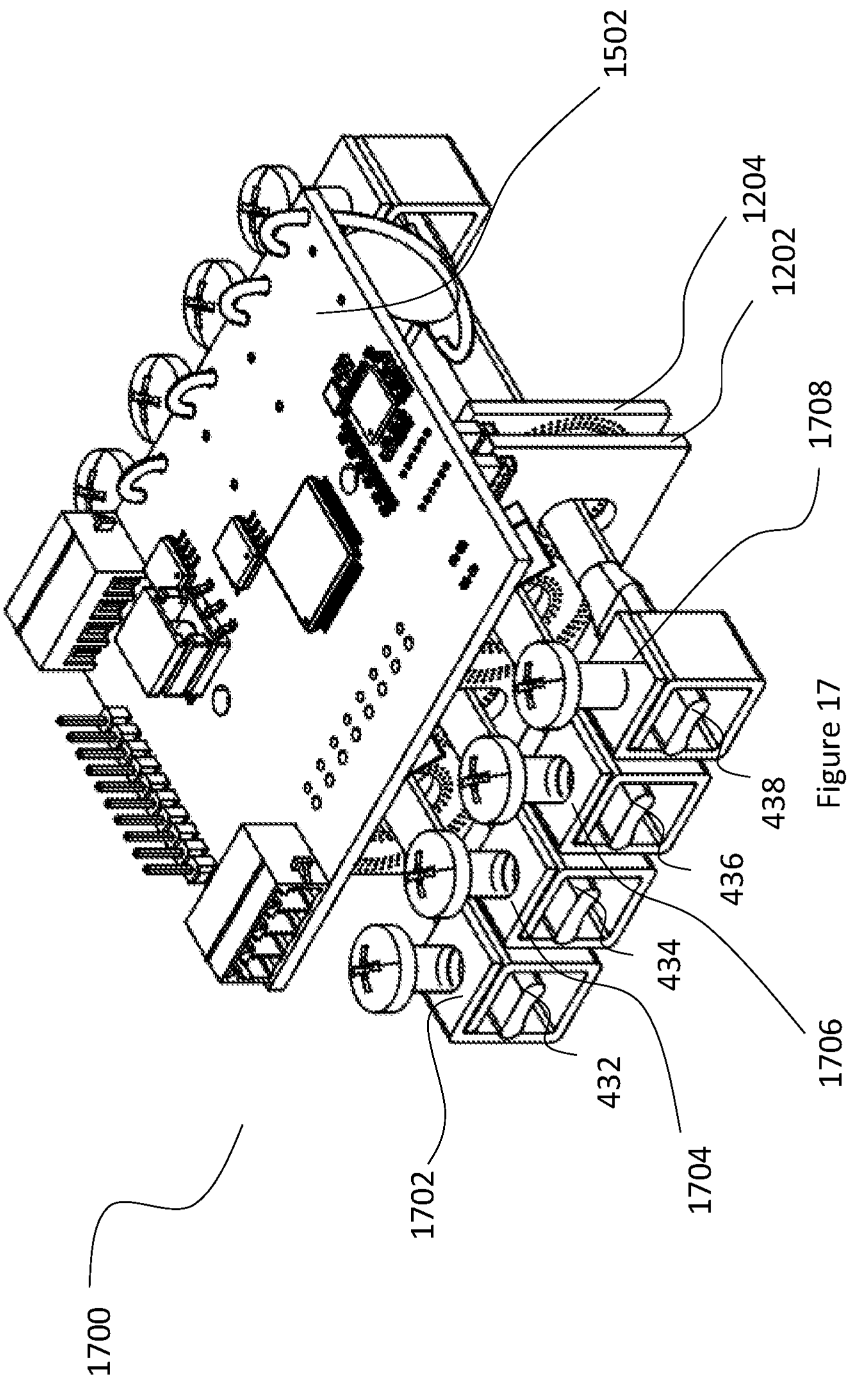
FIG. 17 is an alternative view of the current sensor assembly of FIG. 16, further including terminal blocks.

FIG. 17 shows an alternative view of the current sensor assembly of FIGS. 15 and 16, but also shows the current carrying conductors connected to respective terminal blocks. For example, the first current carrying conductor 432 may be coupled or connected to a first terminal block 1702. The second current carrying conductor 436 may be coupled or connected to a second terminal block 1704. The third current carrying conductor 434 may be coupled or connected to a third terminal block 1706. The fourth current carrying conductor 438 may be coupled or connected to a fourth terminal block 1708. Rotating the current carrying conductors once they have been passed through the openings enables their coupling or connection to the terminal blocks, whilst allowing the width of the openings in the substrates and thus distance between current measurement coils to be minimised.

Figure 18A:
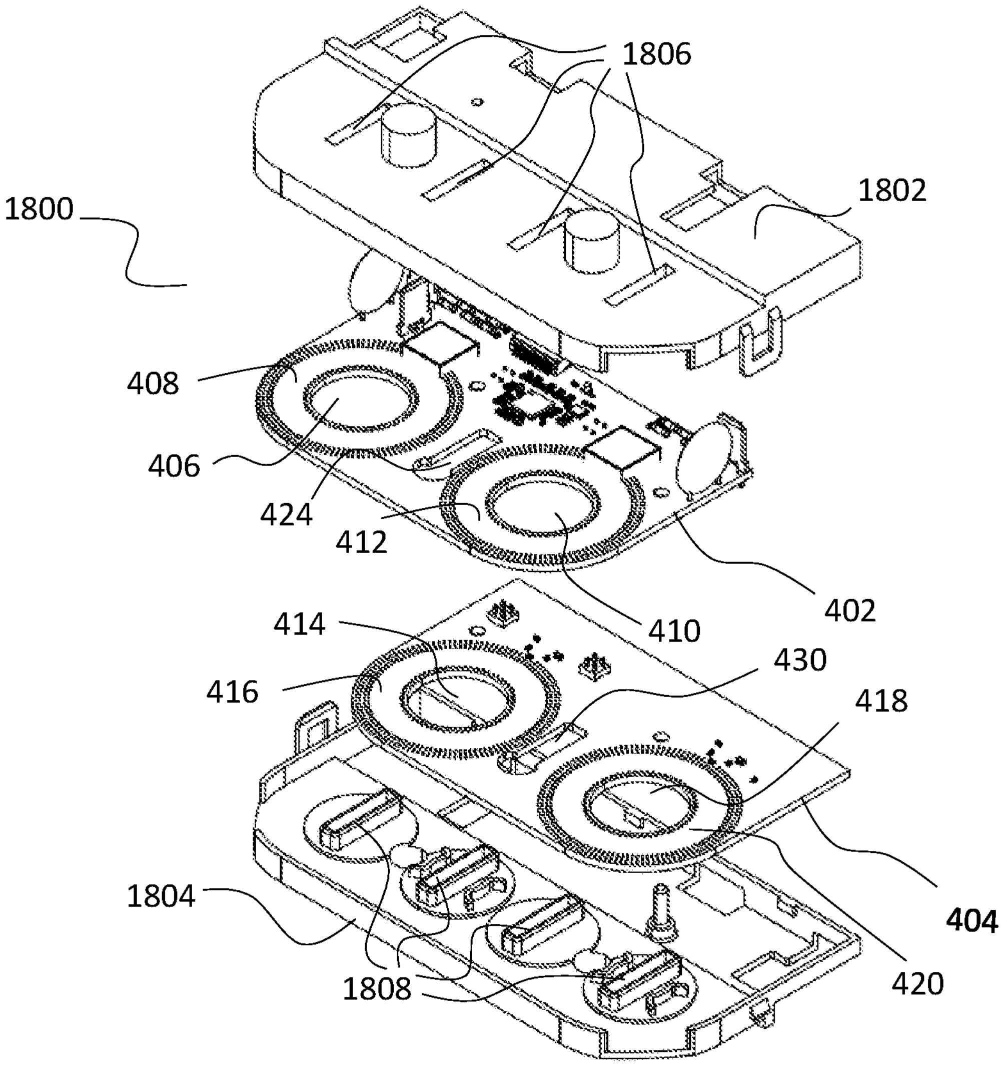
FIG. 18A is an exploded view of a current sensor assembly including a casing.
Figure 18B:
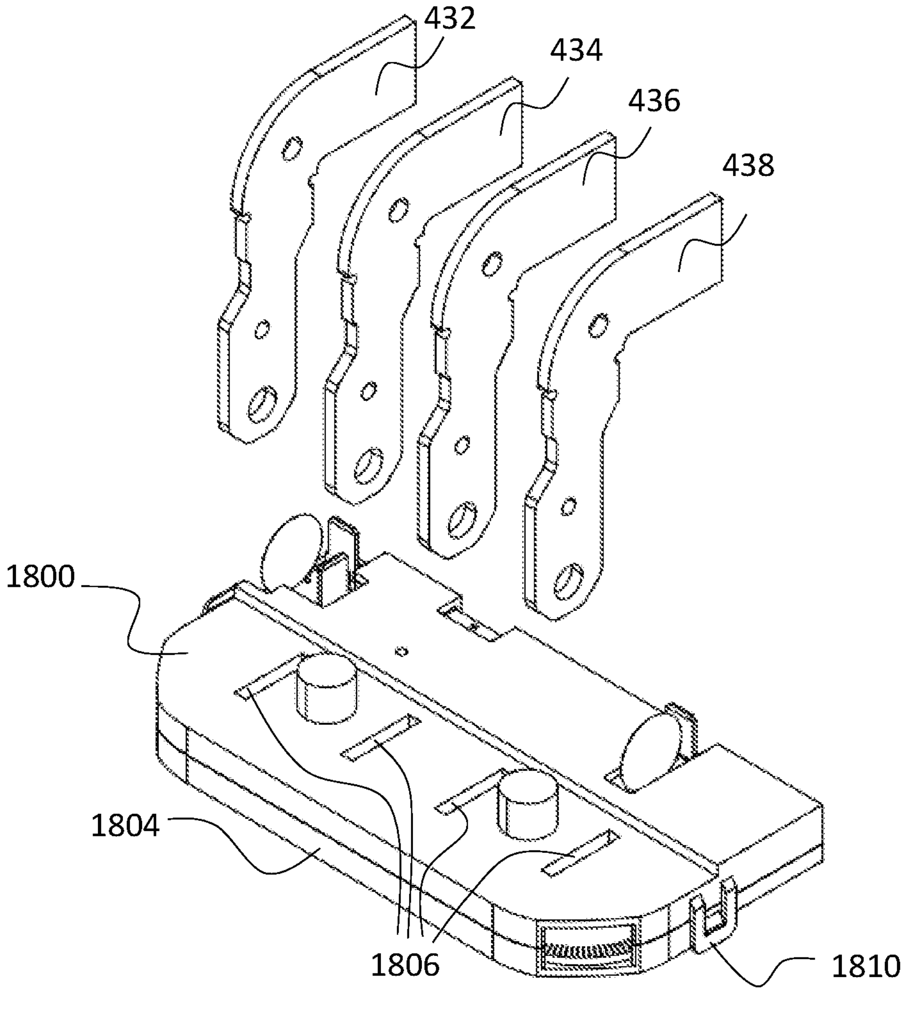
FIG. 18B is a view of the current sensor assembly of FIG. 18A, with the casing secured around the substrates.

FIGS. 18A and 18B shows a further example current sensor assembly 1800 in accordance with an aspect of the present disclosure. FIG. 18A shows an "exploded" view of the assembly and FIG. 18B shows the completed assembly and also the four current carrying conductors 432, 434, 436 and 438 that the assembly 1800 is configured for receiving. The current sensor assembly 1800 includes a first substrate 402 comprising a first current measurement coil 408 surrounding a first hole 406. The first substrate 402 further comprises a second current measurement coil 412 surrounding a second hole 410. A first opening 424 is located between the first current measurement coil 408 and the second current measurement coil 412.

The second substrate 404 may be constructed in a similar manner to the first substrate 402. The second substrate 404 comprises a third current measurement coil 416 surrounding a third hole 414. The second substrate 404 further comprises a second current measurement coil 420 surrounding a second hole 418. A second opening 430 is located between the third current measurement coil 416 and the fourth current measurement coil 420. The substrates represented in this example are similar to those of FIGS. 12A and 12B, but each include only one opening, since the substrates are sized such that a second opening on each substrate is not required.

The current sensor assembly 1800 may optionally further comprise a first cover 1802 and a second cover 1804 arranged to protect the first substrate 402 and the second substrate 404 by surrounding the substrates. The first cover 1802 and the second cover 1804 may connect using a latch 1810 or other connection means. The first cover 1802 may comprise a plurality of openings 1806 and the second cover 1804 may comprise a plurality of openings 1808 arranged to align and allow the plurality of current carrying conductors 432, 434, 436, 438 to pass through.

Figure 19A:
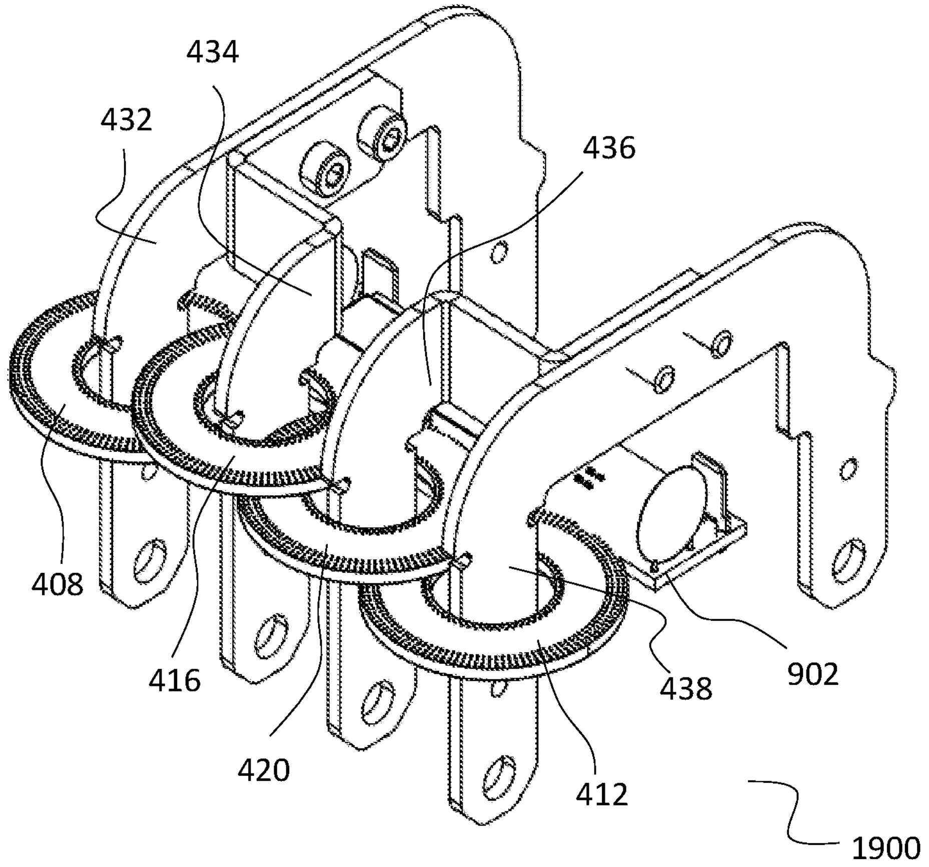
FIG. 19A is an alternative 3D view of the current sensor assembly of FIGS. 9A-9D.
Figure 19B:
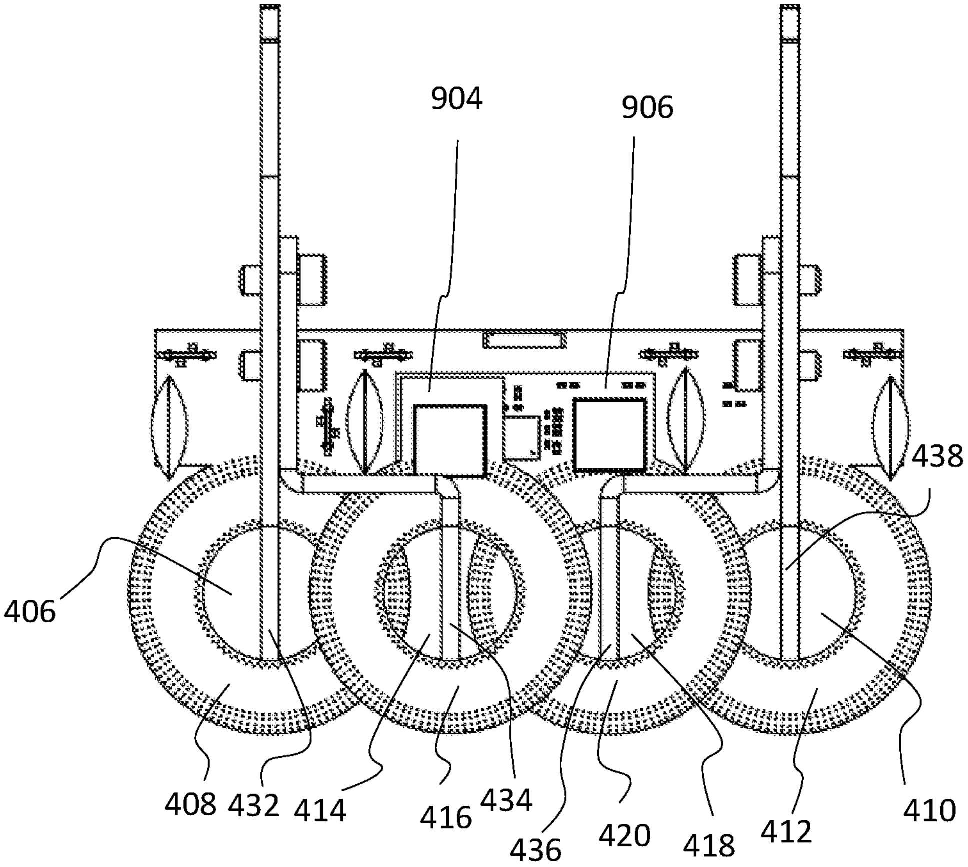
FIG. 19B is an alternative view of the current sensor assembly of FIG. 19A.

FIGS. 19A and 19B show different views of a current sensor assembly 1900 based on the current sensor assembly 900 shown in FIGS. 9A-9D. As noted with respect to FIGS. 9A-9D, the assembly 1900 comprises a first substrate 902 comprising a first measurement coil 408 and a second current measurement coil 412. A second substrate 904 comprises a third current measurement coil 416 and a third substrate 906 comprises a fourth current measurement coil 420.

The current carrying conductors 432, 434, 436 and 438 pass through the holes which are surrounded by respective current measurement coils. The current carrying conductors 432-438 shown in the current sensor assembly 1900 are flattened conductors, allowing the conductors to be coupled together. In this example, the current carrying conductors effectively form a frame to which the substrates 902, 904, 906 can be fixed in order to hold the substrates in position relative to each other and the conductors. The layout of the current carrying conductors shown in FIGS. 19A and 19B matches the ANSI 42S standard. Conductors 432 and 438 may connect to a home or domestic electricity system or circuit, for example. Conductors 434 and 436 may connect to some other related system/circuit, such as a photovoltaic (PV) system or an electric vehicle (EV) charging system. This allows the power consumption or generation of the other related system/circuit to be measured, whilst also providing a dedicated measurement of the current draw of the home network.

Figure 20A:
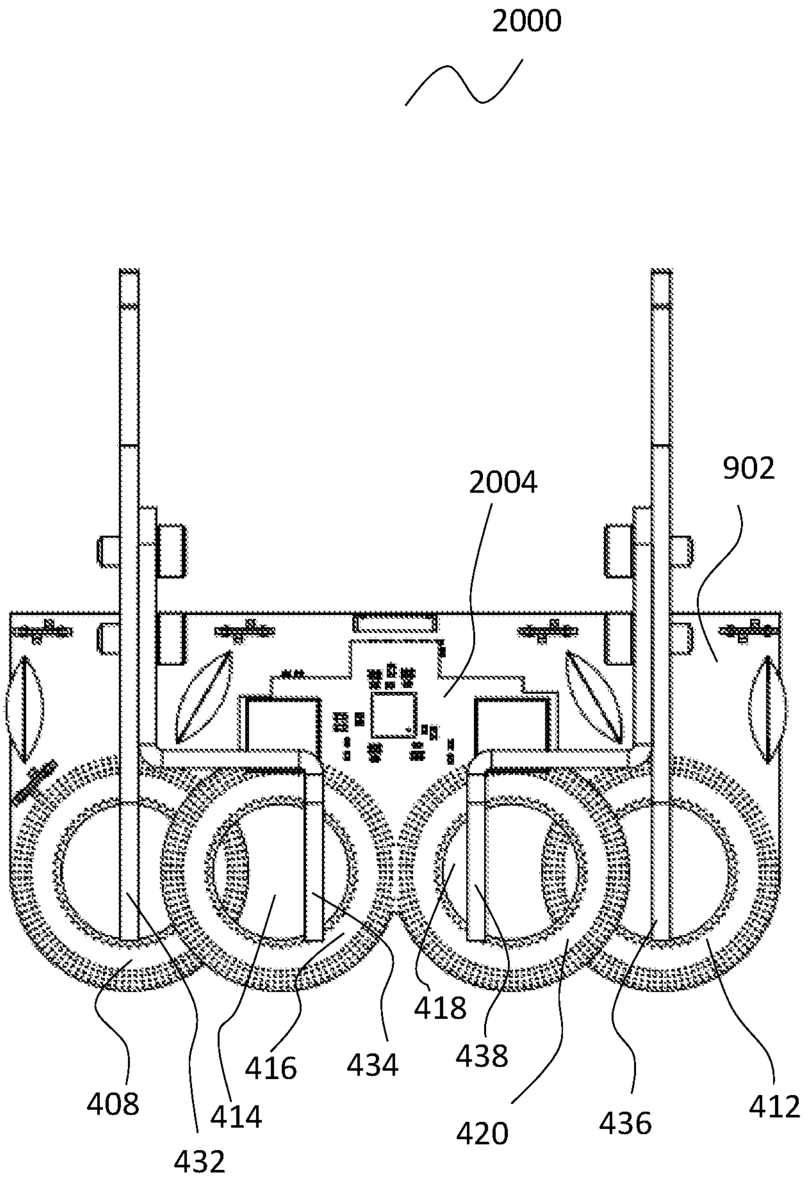
FIG. 20A is a view of a current sensor assembly distributed across two substrates.
Figure 20B:
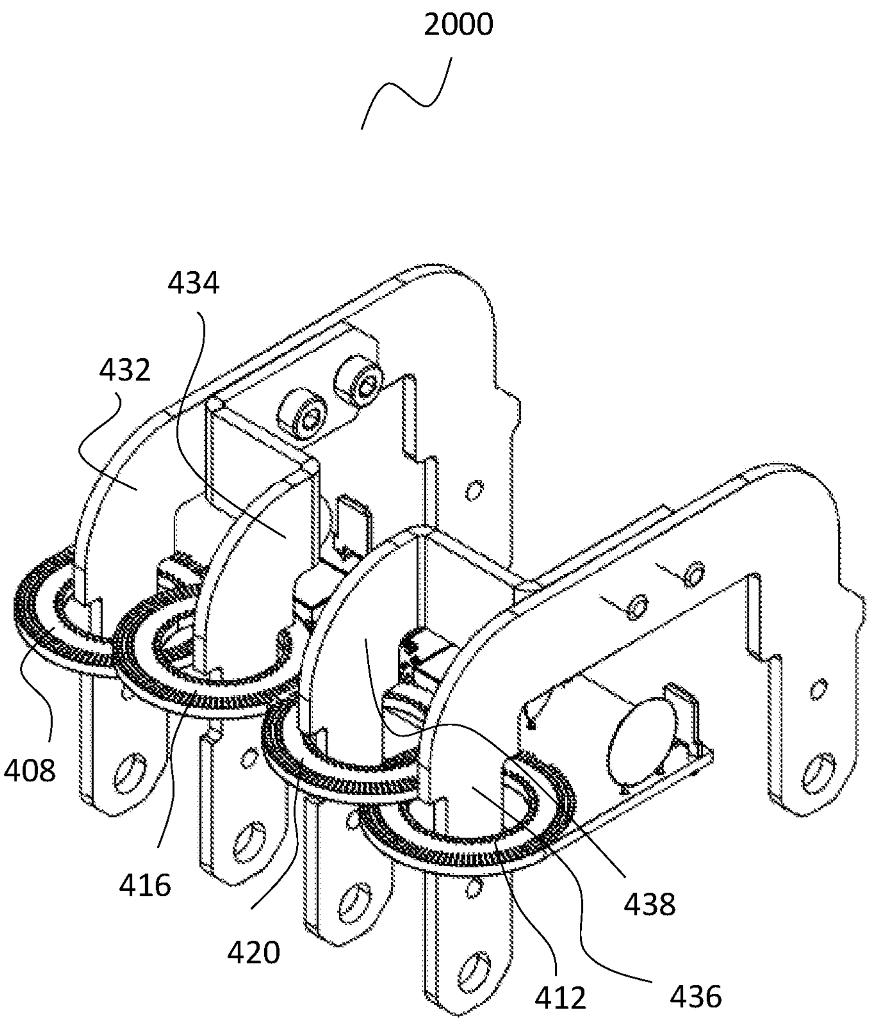
FIG. 20B is a 3D view of the current sensor assembly of FIG. 20A.

FIGS. 20A and 20B show current sensor assembly 2000 which is based on the alternative current sensor assembly described with respect to FIGS. 9A-9D which includes two substrates rather than three substrates. A first substrate 902 comprises a first current measurement coil 408 and a second current measurement coil 412. A second substrate 2004 comprises a third current measurement coil 416 and a fourth current measurement coil 420.

The third and fourth current measurement coils 416, 420 are arranged such that they are positioned between the first current measurement coil 408 and the second current measurement coil 412.

So as to allow the third current measurement coil 416 and the fourth current measurement coil 420 to be placed on the same second substrate 2004, the third current measurement coil 416 may overlap the first current measurement coil 408 and the fourth current measurement coil 420 may overlap the second current measurement coil 412 when viewed from a direction normal to the substrates (for example, when viewed from the perspective shown in FIG. 20A). Further, the third current carrying conductor 434 may be off-centre in the third hole 414 and the fourth current carrying conductor 438 may be off centre in the fourth hole 418. Off centre may mean that the current carrying conductors are not centred on the central part of the respective hole, for example that they do not pass through an axis running through the centre of the respective hole. This allows the third 416 and fourth 420 current measurement coils to be placed on the same substrate 2004, reducing connections between substrates and thus electromagnetic pickup.

Thus, it can be seen that throughout this disclosure, various different example current sensor assemblies are described, all of which include at least two substrates having current measurement coils, with at least one of those substrates having two or more current measurement coils. These arrangements all enable the current sensor assemblies to be used for measuring currents in conductors that are arranged to have relatively small inter-conductor pitches, whilst maintaining good measurement sensitivity because the measurement coils have a relatively large radii and electromagnetic pickup in the measurement signals is minimised by having multiple measurement coils on at least some of the substrates, thereby minimising substrate interconnects.

Various modifications whether by way of addition, deletion, or substitution of features may be made to the above described examples to provide further examples, any and all of which are intended to be encompassed by the appended claims.

For example, the opening between measurement coils on at least the first substrate could be anywhere between the measurement coils, for example equidistant between the coils (such as the examples of FIGS. 4A to 4C) or otherwise (such as the example of FIGS. 18A and 18B).

The current measurement assemblies may or may not include the current carrying conductors that they are configured to measure. For example, the current measurement assembly may include just the two or more substrates having the measurement coils (and optionally any additional component(s) to which the substrates are attached to hold them in place, such as to another PCB/substrate as in the example of FIG. 16 and FIG. 17, or any other suitable type of frame or case, as in the example of FIGS. 18A and 18B). That assembly may be sold/shipped, and the current carrying conductors may be fitted to it on-site, for example at a property where the assembly is to be used for measuring current. Alternatively, it may also include the current carrying conductors, for example as busbars or rods, which may then be connected or coupled on site, for example at a property, to any other suitable components or devices.

Current carrying conductors are conductors that are capable of or suitable for carrying electrical current. The term does not imply that the conductors are actually carrying current at any given moment, or are always carrying current. At many times, the current carrying conductors may not be carrying current at all.

In each of the examples above, the current measurement coils are typically Rogowski coils. However, they may alternatively be any other type of current measurement coil formed on a substrate or PCB. Further, the arrangement of the current measurement coils may be applied to current transducers or measurement coils which are not implemented on a PCB.

The holes and openings described throughout the application are sized such that they are suitable for conductors to pass through at an angle normal to the substrate. However they are not necessarily sized so that they are suitable for conductors to pass through only at the angle normal to the substrate. The holes or openings may be sized such that conductors can pass through at an angle normal to the substrate and also at angles other than normal to the substrate. For example, the holes or openings may be sized to allow the conductors to pass through at angles 5, 10, 20, 30, 45 degrees off normal and still be suitable for the conductors to pass through at an angle normal to the substrate.

Numbered Aspects

Included below are a series of numbered aspects of the disclosure:

1. A current sensor assembly comprising:
   a first substrate comprising:
     a first hole for receiving a first current carrying conductor through the first hole at an angle normal to a surface of the first substrate;
     a first current measurement coil formed on the first substrate, the first current measurement coil arranged around a circumference of the first hole;
     a second hole for receiving a second current carrying conductor through the second hole at an angle normal to the surface of the first substrate;
     a second current measurement coil formed on the first substrate, the second current measurement coil arranged around a circumference of the second hole; and
     a first opening between the first hole and the second hole, wherein the first opening is for receiving a third current carrying conductor through the first opening at an angle normal to the surface of the first substrate; and
   a second substrate comprising:
     a third hole for receiving the third current carrying conductor through the third hole at an angle normal to a surface of the second substrate; and
     a third current measurement coil formed on the second substrate, the third current measurement coil arranged around a circumference of the third hole.
2. The current sensor assembly according to aspect 1, wherein:
   the second substrate further comprises:
     a fourth hole for receiving a fourth current carrying conductor through the fourth hole at an angle normal to the surface of the second substrate;
     a fourth current measurement coil formed on the second substrate, the fourth current measurement coil arranged around a circumference of the fourth hole.
3. The current sensor assembly according to aspect 1 further comprising:
   a third substrate comprising:
     a fourth hole for receiving a fourth current carrying conductor through the fourth hole at an angle normal to a surface of the third substrate;
     a fourth current measurement coil formed on the third substrate, the fourth current measurement coil arranged around a circumference of the fourth hole.
4. The current sensor assembly according to aspect 2, wherein the second substrate further comprises:
   a second opening between the third current measurement coil and the fourth current measurement coil, the opening for receiving the second current carrying conductor through the second opening at an angle normal to the surface of the second substrate.
5. The current sensor assembly according to aspect 2 or aspect 3, wherein the first opening between the first hole and the second hole is also for receiving the fourth current carrying conductor through the first opening at an angle normal to the surface of the first substrate.
6. The current sensor assembly according to any preceding aspect, wherein the first current measurement coil and the third current measurement overlap when viewed in a direction normal to the surface of the first substrate and the second substrate.
7. The current sensor assembly according to any preceding aspect, wherein the first measurement coil has a first radius, the second measurement coil has a second radius and the third measurement coil has a third radius, and
   wherein the first substrate and the second substrate are arranged such that a distance between the first hole and the third hole in a direction parallel to the surface of the first substrate is less than the sum of the first radius and the third radius.
8. The current sensor assembly according to any preceding aspect, wherein each of the holes has a circular cross-section.
9. The current sensor assembly according to any preceding aspect, wherein the first opening has an oblong cross-section.
10. The current sensor assembly according to any of aspects 1-8, wherein the first opening is a cut-away section of the first substrate.
11. The current sensor assembly according to any preceding aspect, further comprising:
   a first current carrying conductor passing through the first hole;
   a second current carrying conductor passing through the second hole; and
   a third current carrying conductor passing through the third hole and the first opening.
12. The current sensor assembly according to aspect 11, wherein a first end of the current carrying conductors have a first cross-section, and a central section of the current carrying conductors has a second cross-section.
13. The current sensor assembly according to aspect 12, wherein the first cross section is an oblong cross section and wherein the second cross section is a circular cross section.
14. A current measurement system comprising:
   a first substrate comprising:
     a first hole;
     a first current measurement coil formed on the first substrate around the first hole;
     a second hole;
     a second current measurement coil formed on the first substrate around the second hole;
     a first opening;
   a second substrate comprising:
     a third hole;

a third current measurement coil formed on the second substrate around the third hole;

a first current carrying conductor;

a second current carrying conductor;

a third current carrying conductor; and wherein the first substrate and the second substrate are aligned such that the first current carrying conductor passes through the first hole, the second current carrying conductor passes through the second hole and the third current carrying conductor passes through the first opening and the third hole.

15. The current measurement system according to aspect 14, wherein:

the second substrate further comprises:

a fourth hole;

a fourth current measurement coil formed on the second substrate around the second hole;

a second opening; and the current measurement system comprises a fourth current carrying conductor;

wherein the first substrate and the second substrate are aligned such that the fourth current carrying conductor passes through the fourth hole and the second current carrying conductor passes through the second opening.

16. The current measurement system according to aspect 15, further comprising:

a first terminal block coupled to a first end of the first current carrying conductor;

a second terminal block coupled to a first end of the second current carrying conductor;

a third terminal block coupled to a first end of the third current carrying conductor;

a fourth terminal block coupled to a first end of the fourth current carrying conductor.

17. The current measurement system according to aspect 16, wherein the first ends of the current carrying conductors have an oblong cross section.

18. A current measurement system comprising:

a first substrate comprising:

a first hole;

a first current measurement coil formed on the first substrate, the first current measurement coil arranged around a circumference of the first hole;

a second hole;

a second current measurement coil formed on the first substrate, the second current measurement coil arranged around a circumference of the second hole;

a first opening between the first hole and the second hole; and a second substrate comprising:

a third hole;

a third current measurement coil formed on the second substrate, the third current measurement coil arranged around a circumference of the third hole;

a fourth hole;

a fourth current measurement coil formed on the second substrate, the fourth current measurement coil arranged around a circumference of the fourth hole;

a second opening between the third hole and the fourth hole; and wherein the first substrate and the second substrate are positioned such that the first opening is aligned with the third hole, and the second opening is aligned with the second hole.

19. The current measurement system according to aspect 18, wherein the first current measurement coil abuts an edge of the first substrate and wherein the fourth current measurement coil abuts an edge of the second substrate.

20. The current measurement coil according to aspect 18 or aspect 19, wherein the first opening and the second opening are open-sided openings.

The invention claimed is:

1. A current sensor assembly comprising:

a first substrate comprising:

a first hole for receiving a first current carrying conductor through the first hole at an angle normal to a surface of the first substrate;

a first current measurement coil formed on the first substrate, the first current measurement coil arranged around a circumference of the first hole;

a second hole for receiving a second current carrying conductor through the second hole at an angle normal to the surface of the first substrate;

a second current measurement coil formed on the first substrate, the second current measurement coil arranged around a circumference of the second hole; and a first opening between the first hole and the second hole, wherein the first opening is for receiving a third current carrying conductor through the first opening at an angle normal to the surface of the first substrate; and a second substrate comprising:

a third hole for receiving the third current carrying conductor through the third hole at an angle normal to a surface of the second substrate; and a third current measurement coil formed on the second substrate, the third current measurement coil arranged around a circumference of the third hole;

wherein the first opening is a cut-away section of the first substrate.

2. The current sensor assembly according to claim 1, wherein:

the second substrate further comprises:

a fourth hole for receiving a fourth current carrying conductor through the fourth hole at an angle normal to the surface of the second substrate; and a fourth current measurement coil formed on the second substrate, the fourth current measurement coil arranged around a circumference of the fourth hole.

3. The current sensor assembly according to claim 2, wherein the second substrate further comprises:

a second opening between the third current measurement coil and the fourth current measurement coil, the opening for receiving the second current carrying conductor through the second opening at an angle normal to the surface of the second substrate.

4. The current sensor assembly according to claim 2, wherein the first opening between the first hole and the second hole is also for receiving the fourth current carrying conductor through the first opening at an angle normal to the surface of the first substrate.

5. The current sensor assembly according to claim 1 further comprising:

a third substrate comprising:

a fourth hole for receiving a fourth current carrying conductor through the fourth hole at an angle normal to a surface of the third substrate; and a fourth current measurement coil formed on the third substrate, the fourth current measurement coil arranged around a circumference of the fourth hole.

6. The current sensor assembly according to claim 1, wherein the first current measurement coil and the third current measurement coil overlap when viewed in a direction normal to the surface of the first substrate and the second substrate.

7. The current sensor assembly according to claim 1, wherein the first measurement coil has a first radius, the second measurement coil has a second radius and the third measurement coil has a third radius, and wherein the first substrate and the second substrate are arranged such that a distance between the first hole and the third hole in a direction parallel to the surface of the first substrate is less than a sum of the first radius and the third radius.

8. The current sensor assembly according to claim 1, wherein each of the holes has a circular cross-section.

9. The current sensor assembly according to claim 1, wherein the first opening has an oblong cross-section.

10. The current sensor assembly according to claim 1, further comprising:

a first current carrying conductor passing through the first hole;

a second current carrying conductor passing through the second hole; and a third current carrying conductor passing through the third hole and the first opening.

11. The current sensor assembly according to claim 10, wherein a first end of the current carrying conductors have a first cross-section, and a central section of the current carrying conductors has a second cross-section.

12. The current sensor assembly according to claim 11, wherein the first cross-section is an oblong cross section and wherein the second cross-section is a circular cross section.

13. A current measurement system comprising:

a first substrate comprising:

a first hole;

a first current measurement coil formed on the first substrate around the first hole;

a second hole;

a second current measurement coil formed on the first substrate around the second hole; and a first opening;

a second substrate comprising:

a third hole;

a third current measurement coil formed on the second substrate around the third hole;

a first current carrying conductor;

a second current carrying conductor;

a third current carrying conductor; and a second opening; and wherein the first substrate and the second substrate are aligned such that the first current carrying conductor passes through the first hole, the second current carrying conductor passes through the second hole and the third current carrying conductor passes through the first opening and the third hole, and wherein the first opening is an open-sided opening extending to an edge of the first substrate and the second opening is an open-sided opening extending to an edge of the second substrate.

14. The current measurement system according to claim 13, wherein:

the second substrate further comprises:

a fourth hole;

a fourth current measurement coil formed on the second substrate around the fourth hole; and the current measurement system comprises a fourth current carrying conductor;

wherein the first substrate and the second substrate are aligned such that the fourth current carrying conductor passes through the fourth hole and the second current carrying conductor passes through the second opening.

15. The current measurement system according to claim 14, further comprising:

a first terminal block coupled to a first end of the first current carrying conductor;

a second terminal block coupled to a first end of the second current carrying conductor;

a third terminal block coupled to a first end of the third current carrying conductor; and a fourth terminal block coupled to a first end of the fourth current carrying conductor.

16. The current measurement system according to claim 15, wherein the first ends of the current carrying conductors have an oblong cross section.

17. A current measurement system comprising:

a first substrate comprising:

a first hole;

a first current measurement coil formed on the first substrate, the first current measurement coil arranged around a circumference of the first hole;

a second hole;

a second current measurement coil formed on the first substrate, the second current measurement coil arranged around a circumference of the second hole; and a first opening between the first hole and the second hole; and a second substrate comprising:

a third hole;

a third current measurement coil formed on the second substrate, the third current measurement coil arranged around a circumference of the third hole;

a fourth hole;

a fourth current measurement coil formed on the second substrate, the fourth current measurement coil arranged around a circumference of the fourth hole;

a second opening between the third hole and the fourth hole;

wherein the first substrate and the second substrate are positioned such that the first opening is aligned with the third hole, and the second opening is aligned with the second hole, and wherein the first opening is an open-sided opening extending to an edge of the first substrate and the second opening is an open-sided opening extending to an edge of the second substrate.

18. The current measurement system according to claim 17, wherein the first current measurement coil abuts an edge of the first substrate and wherein the fourth current measurement coil abuts an edge of the second substrate.

* * * * *